US012322609B2

(12) United States Patent
Sato et al.

(10) Patent No.: US 12,322,609 B2
(45) Date of Patent: Jun. 3, 2025

(54) SUBSTRATE PROCESSING APPARATUS AND SUBSTRATE PROCESSING METHOD

(71) Applicant: EBARA CORPORATION, Tokyo (JP)

(72) Inventors: Kohei Sato, Tokyo (JP); Hiroki Takahashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 12 days.

(21) Appl. No.: 18/087,619

(22) Filed: Dec. 22, 2022

(65) Prior Publication Data

US 2023/0207339 A1  Jun. 29, 2023

(30) Foreign Application Priority Data

Dec. 28, 2021  (JP) ................ 2021-214690

(51) Int. Cl.
*H01L 21/67* (2006.01)
(52) U.S. Cl.
CPC .. *H01L 21/67051* (2013.01); *H01L 21/67248* (2013.01)
(58) Field of Classification Search
CPC ............ H01L 21/67051; H01L 21/67248
See application file for complete search history.

(56) References Cited

U.S. PATENT DOCUMENTS

| 2002/0007840 A1 | 1/2002 | Atoh |
| 2008/0289652 A1 | 11/2008 | Hamada |
| 2009/0047103 A1* | 2/2009 | Inamasu ............... B65G 49/068 118/500 |
| 2016/0372341 A1* | 12/2016 | Kobayashi .......... H01L 21/6715 |
| 2022/0068682 A1* | 3/2022 | Yamaguchi ....... H01L 21/67769 |
| 2022/0171373 A1* | 6/2022 | Chau ...................... C23C 14/54 |

FOREIGN PATENT DOCUMENTS

| JP | 2002/043267 A | 2/2002 | |
| JP | 2010/074191 A | 4/2010 | |
| JP | 2013077796 A * | 4/2013 | ........... G06Q 10/06 |
| JP | 2019160910 A * | 9/2019 | ....... H01L 21/30604 |
| WO | WO 2021/117485 A1 | 6/2021 | |

OTHER PUBLICATIONS

Machine translation of JP-2019160910-A, dated Sep. 19, 2019. (Year: 2019).*

* cited by examiner

Primary Examiner — Joseph L. Perrin
Assistant Examiner — Kevin G Lee
(74) Attorney, Agent, or Firm — BakerHostetler

(57) ABSTRACT

A substrate processing apparatus includes: a first module used in a substrate processing process; a second module used in a substrate processing process after the first module; a nozzle provided in the second module and configured to supply a target treatment liquid; a temperature detector that detects a temperature of a treatment liquid inside the nozzle or a temperature of the nozzle; a substrate detection sensor that detects a position of a substrate; and a controller that controls discharge of the target treatment liquid from the nozzle performed before the substrate is conveyed to the second module according to the temperature of the treatment liquid detected by the temperature detector and the position of the substrate.

11 Claims, 17 Drawing Sheets

FIG.14

| | TB1-B | MEASURED TEMPERATURE T [°C] | DISPENSING DURATION t [SECONDS] |
|---|---|---|---|

| TB1-A | MEASURED TEMPERATURE T [°C] | DISPENSING DURATION t [SECONDS] |
|---|---|---|

| TB1-W | MEASURED TEMPERATURE T [°C] | DISPENSING DURATION t [SECONDS] |
|---|---|---|
| | 25 | 25 |
| | ... | ... |
| | 30 | 6 |
| | ... | ... |
| | 45 | 4 |
| | ... | ... |

FIG.15

| MODULE NAME | STANDARD PROCESSING TIME [SECONDS] |
|---|---|
| POLISHING MODULE | 60 |
| FIRST CLEANING MODULE | 50 |
| SECOND CLEANING MODULE | 40 |
| ... | ... |

TB2

SUBSTRATE PROCESSING APPARATUS AND SUBSTRATE PROCESSING METHOD

CROSS REFERENCE TO RELATED APPLICATION

This application claims priority to Japanese Patent Application No. 2021-214690 filed Dec. 28, 2021, the entire contents of which are hereby incorporated by reference.

BACKGROUND

Technical Field

The present technology relates to a substrate processing apparatus and a substrate processing method.

Related Art

In a process of manufacturing a semiconductor element, various films having different physical properties are formed on a substrate (for example, a wafer), and these films are subjected to various processes to form fine wiring. For example, in a damascene process, a wiring groove is formed in a film, a metal such as copper (Cu) is embedded in the wiring groove, and an excessive metal is removed by chemical mechanical polishing (CMP), thereby forming a metal wiring. Since components of a polishing agent and polishing wastes remain on a surface of the substrate after the CMP treatment, it is necessary to remove these components and polishing wastes by a cleaning module included in a substrate processing apparatus. For example, the cleaning module is configured to scrub the surface of the substrate with a roll-shaped or pencil-shaped sponge member while supplying a chemical solution to the surface of the substrate that is rotating, and finally rinse the chemical liquid with a rinse liquid such as pure water.

The substrate cleaning devices described in JP 2002-43267 A and JP 2010-74191 A are mainly applied in a wiring step (BEOL) of forming multilayer wiring made of copper or the like. In recent years, due to the necessity of increasing the speed of a logic element and reducing the cost of a memory element, application of the CMP has been spreading to a transistor process (FEOL) for forming a switching circuit. Since the FEOL has a smaller film thickness, wiring width, and inter-wiring space than the BEOL, it is essential to improve removal performance against particulate contamination, molecular contamination, and metal element contamination. As a means for realizing this, a cleaning method using promotion of a chemical action by heating a chemical solution is promising. For example, a substrate cleaning device described in WO 2021/117485 A is a substrate cleaning device that cleans a substrate by rotating the substrate horizontally held by a holding member, and supplies a heated treatment liquid to an upper surface and a lower surface of the substrate while ensuring temperature uniformity in a substrate surface. However, in WO 2021/117485 A, it is not necessary to adopt a mechanism for directly heating the substrate with an external heater 101 or the like and to provide a mechanism for accurately grasping a temperature of the supply liquid at a use point (for example, nozzle). For this reason, in the case of a device not provided with a mechanism for directly heating a substrate or in consideration of a control width required for a recent process technology, the applicant has found a need to further improve the technology in order to suppress variations in a treatment effect (for example, a cleaning effect or a polishing effect) depending on the timing of treatment of the substrate.

Furthermore, in substrate processing of a lot including a plurality of substrates, when a substrate is cleaned by discharging a heated chemical solution from a nozzle, the nozzle moves to a cleaning position and new cleaning processing is started (See WO 2021/117485 A, FIG. 11, etc.), but a cleaning liquid is not discharged from the nozzle until the substrate is processed. Considering the fact that the waiting time until the start of the treatment of the substrate varies for each of the different lots in the plurality of substrate treatments and that the temperature of the treatment liquid supplied to the first substrate decreases before the start of the treatment, for example, when only the treatment performance of the first substrate (for example, cleaning performance or polishing performance) is taken, it has been found that it is better to further improve the treatment performance of the first substrate of each of the different lots when viewed on the basis of more strict process requirements.

SUMMARY

The present technology has been made in view of the above problems, and it is desirable to provide a substrate processing apparatus and a substrate processing method that are further improved in continuously processing a plurality of substrates.

A substrate processing apparatus according to an embodiment includes: a first module used in a substrate processing process; a second module used in a substrate processing process after the first module; a nozzle provided in the second module and configured to supply a target treatment liquid; a temperature detector that detects a temperature of a treatment liquid inside the nozzle or a temperature of the nozzle; a substrate detection sensor that detects a position of a substrate; and a controller that controls discharge of the target treatment liquid from the nozzle performed before the substrate is conveyed to the second module according to the temperature of the treatment liquid detected by the temperature detector and the position of the substrate. Note that the target treatment liquid refers to a treatment liquid to be subjected to temperature control.

A substrate processing method according to an embodiment is a control method in a substrate processing apparatus including a first module used in a substrate processing process, a second module used in a substrate processing process after the first module, a nozzle provided in the second module and configured to supply a target treatment liquid, a temperature detector that detects a temperature of a treatment liquid inside the nozzle or a temperature of the nozzle, and a substrate detection sensor that detects a position of a substrate, the control method including controlling, by a controller, discharge of the target treatment liquid from the nozzle before the substrate is conveyed to the second module according to the temperature of the treatment liquid detected by the temperature detector and the position of the substrate.

BRIEF DESCRIPTION OF THE DRAWINGS

FIG. 14 is an example of a table of a database constructed in a storage device 410;

FIG. 15 is an example of a table stored in the storage device 410;

DETAILED DESCRIPTION

Figure 1:
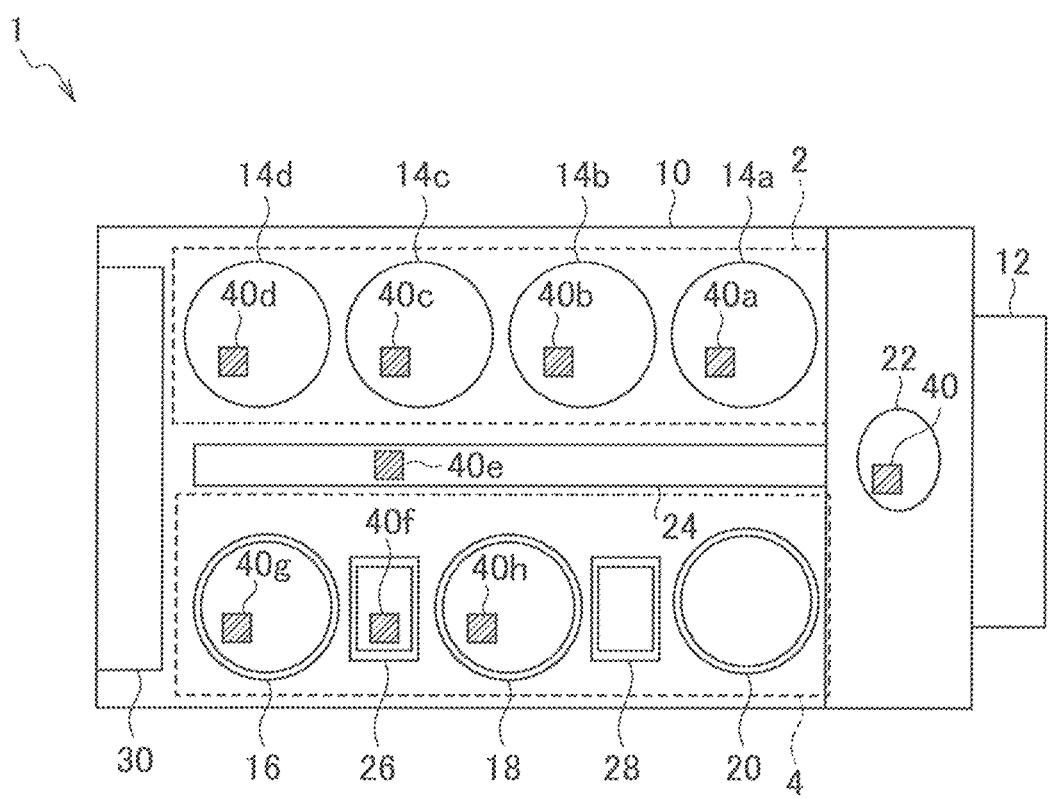
FIG. 1 is a plan view illustrating a schematic overall configuration of a substrate processing apparatus according to the present embodiment.

Hereinafter, each embodiment will be described with reference to the drawings. However, unnecessarily detailed description may be omitted. For example, a detailed description of a well-known matter and a duplicate description of substantially the same configuration may be omitted. This is to avoid unnecessary redundancy of the following description and to facilitate understanding of those skilled in the art.

A substrate processing apparatus according to a first aspect of the present technology includes: a first module used in a substrate processing process; a second module used in a substrate processing process after the first module; a nozzle provided in the second module and configured to supply a target treatment liquid; a temperature detector that detects a temperature of a treatment liquid inside the nozzle or a temperature of the nozzle; a substrate detection sensor that detects a position of a substrate; and a controller that controls discharge of the target treatment liquid from the nozzle performed before the substrate is conveyed to the second module according to the temperature of the treatment liquid detected by the temperature detector and the position of the substrate. Note that the target treatment liquid refers to a treatment liquid to be subjected to temperature control.

According to this configuration, it is possible to provide a substrate processing apparatus that can solve at least a part of the above problems and is further improved in continuously processing a plurality of substrates.

A substrate processing apparatus according to a second aspect of the present technology is the substrate processing apparatus according to the first aspect, in which the controller controls discharge of the target treatment liquid from the nozzle performed before the substrate is conveyed to the second module according to the temperature detected by the temperature detector when the substrate detection sensor detects that the substrate is located in the first module.

A substrate processing apparatus according to a third aspect of the present technology is the substrate processing apparatus according to the first or second aspect, in which the substrate detection sensor includes a first substrate detection sensor that detects presence or absence of the substrate in the first module, and the controller performs control to discharge the target treatment liquid from the nozzle in a case where the temperature detected by the temperature detector at a timing when the substrate is detected by the first substrate detection sensor is lower than a target set temperature.

A substrate processing apparatus according to a fourth aspect of the present technology is the substrate processing apparatus according to the third aspect, the substrate detection sensor includes a second substrate detection sensor that is provided in the second module and detects presence or absence of the substrate, and the controller performs control to discharge the target treatment liquid from the nozzle in a case where the temperature detected by the temperature detector at a timing when the substrate is detected by the first substrate detection sensor is lower than a target set temperature and the substrate is not detected by the second substrate detection sensor.

A substrate processing apparatus according to a fifth aspect of the present technology is the substrate processing apparatus according to the first or second aspect, in which the controller performs control to discharge the treatment liquid from the nozzle at a timing when the substrate no longer exists in the first module in a case where the temperature detected by the temperature detector is higher than a target set temperature and a lower limit set temperature lower than the target set temperature, and the controller performs control to discharge the target treatment liquid from the nozzle at a set timing before the processing process in the first module ends in a case where the temperature detected by the temperature detector is lower than the lower limit set temperature.

A substrate processing apparatus according to a sixth aspect of the present technology is the substrate processing apparatus according to the fifth aspect, in which the first module is a polishing module, and the set timing before the processing process ends is a timing when a main polishing process ends.

A substrate processing apparatus according to a seventh aspect of the present technology is the substrate processing apparatus according to any one of the first to sixth aspects, in which the controller performs control to issue a notification in a case where the substrate is detected by a first substrate detection sensor and the temperature detected by the temperature detector is lower than a target set temperature, and in a case where the substrate is detected by a second substrate detection sensor.

A substrate processing apparatus according to an eighth aspect of the present technology is the substrate processing apparatus according to the first or second aspect, in which the controller determines execution timing and duration of the discharge according to the temperature detected by the temperature detector, and performs control to discharge the target treatment liquid from the nozzle at the execution timing and duration of the discharge.

A substrate processing apparatus according to a ninth aspect of the present technology is the substrate processing apparatus according to the eighth aspect, further including a storage device that stores, for every temperature of the treatment liquid in the nozzle or every temperature of the nozzle, a dispensing duration required for the treatment liquid to reach a target set temperature from the temperature, in which the controller acquires, from the storage device, a dispensing duration corresponding to the temperature detected by the temperature detector when the substrate detection sensor detects that the substrate is located in the first module, and performs control to discharge the target treatment liquid from the nozzle for the dispensing duration or longer from a time earlier than a predicted substrate processing start time in the second module by the dispensing duration or longer.

A substrate processing apparatus according to a tenth aspect of the present technology is the substrate processing apparatus according to the ninth aspect, in which the storage device further stores a type of the treatment liquid, and a temperature of the treatment liquid in the nozzle or a temperature of the nozzle in association with a target set temperature in addition to a dispensing duration required for the treatment liquid to reach the target set temperature from the temperature, and the controller acquires, as the dispensing duration from the storage device, a dispensing duration corresponding to the temperature detected by the temperature detector and the type of the treatment liquid in the second module when the substrate is provided in the first module.

A substrate processing apparatus according to an eleventh aspect of the present technology is the substrate processing apparatus according to any one of the first to tenth aspects, further including: a supply pipe that supplies a treatment liquid to the nozzle; and a valve provided in the supply pipe, in which controlling to discharge the treatment liquid from the nozzle is controlling to open the valve.

A substrate processing method according to a twelfth aspect of the present technology is a control method in a substrate processing apparatus including a first module used in a substrate processing process, a second module used in a substrate processing process after the first module, a nozzle provided in the second module and configured to supply a target treatment liquid, a temperature detector that detects a temperature of a treatment liquid inside the nozzle or a temperature of the nozzle, and a substrate detection sensor that detects a position of a substrate, the control method including controlling, by a controller, discharge of the target treatment liquid from the nozzle before the substrate is conveyed to the second module according to the temperature of the treatment liquid detected by the temperature detector and the position of the substrate.

According to this configuration, it is possible to provide a substrate processing method that can solve at least a part of the above problems and is further improved in continuously processing a plurality of substrates.

In addition to the above problems, conventionally, there is a case where preliminary dispensing of discharging a treatment liquid in advance is performed in order to increase the temperature of the treatment liquid. However, since the preliminary dispensing is performed only at a flow rate set for each set time, there is a problem that the optimum preliminary dispensing cannot be performed so that the treatment liquid has a target set temperature. Furthermore, there is a problem that the pre-dispensing is continuously performed even after the treatment liquid reaches the target set temperature, and there is a problem that the pre-dispensing is excessively performed and the treatment liquid is discarded uselessly. On the other hand, in one aspect of the present embodiment, the dispensing is optimized.

A substrate processing method according to the present embodiment is one process of a substrate processing method used in a substrate processing apparatus that processes a substrate such as a semiconductor wafer, and includes a substrate cleaning process of cleaning the substrate by bringing the substrate into contact with a sponge member while supplying a treatment liquid to the substrate. This substrate cleaning process can be applied not only to a process of manufacturing a semiconductor memory element or a logic element, but also to a process of manufacturing a flat panel display, a process of manufacturing an image sensor such as a CMOS or a CCD, and the like.

In the present embodiment, a polishing apparatus that performs chemical mechanical polishing (CMP) will be described as an example of a substrate processing apparatus.

FIG. 1 is a plan view illustrating a schematic overall configuration of a substrate processing apparatus. As illustrated in FIG. 1, a substrate processing apparatus 1 includes a rectangular housing 10 and a load port 12 on which a substrate cassette for stocking substrates such as a plurality of semiconductor wafers is placed, and the load port 12 is disposed adjacent to the housing 10. Inside the housing 10, polishing modules 14a to 14d for polishing principal surfaces of the substrates, a first cleaning module 16 for primarily cleaning the polished substrates, a second cleaning module 18 for finish-cleaning the primarily cleaned substrates, a drying module 20 for drying the finish-cleaned substrates, and a controller 30 for controlling the movement of each device are provided.

The polishing modules 14a to 14d are arranged along a longitudinal direction of the substrate processing apparatus, and the first cleaning module 16, the second cleaning module 18, and the drying module 20 are also arranged along the longitudinal direction of the substrate processing apparatus. In a region surrounded by the load port 12, the polishing module 14a, and the drying module 20, a first conveyance robot 22 is disposed, and a substrate transfer module 24 is disposed in parallel to the arrangement of the polishing modules 14a to 14d. The first conveyance robot 22 receives a substrate before being polished from the load port 12 and transfers the substrate to the substrate transfer module 24, and further receives the dried substrate from the drying module 20 and returns the substrate to the load port 12. The substrate transfer module 24 conveys the substrate received from the first conveyance robot 22, and transfers the substrate to and from the polishing modules 14a to 14d.

A second conveyance robot 26 is disposed in a region surrounded by the first cleaning module 16, the second cleaning module 18, and the substrate transfer module 24.

The second conveyance robot 26 receives the polished substrate from the substrate transfer module 24 and transfers the substrate to the first cleaning module 16, and receives the substrate after the primary cleaning from the first cleaning module 16 and transfers the substrate to the second cleaning module 18. A third conveyance robot 28 is disposed between the second cleaning module 18 and the drying module 20. The third conveyance robot 28 receives the substrate after finish cleaning from the second cleaning module 18 and passes the substrate to the drying module 20.

The substrate processing apparatus 1 includes the controller 30 disposed inside the housing 10. The controller 30 is configured to control the movement of each device of the substrate processing apparatus 1.

The first conveyance robot 22, the polishing modules 14a to 14d, the substrate transfer module 24, the second conveyance robot 26, the first cleaning module 16, and the second cleaning module 18 are provided with substrate detection sensors 40 to 40h for detecting a position of the substrate, respectively. The substrate detection sensors 40 to 40h detect, for example, the presence or absence of the substrate. As a result, the controller 30 monitors where a substrate W is present in the substrate processing apparatus by acquiring signals from these substrate detection sensors 40 to 40h.

Each of the substrate detection sensors 40 to 40h may be a contact sensor that detects contact or a non-contact sensor that detects the presence or absence of the substrate in a non-contact manner. In the case of the non-contact sensor, for example, each of the substrate detection sensors 40 to 40h may detect light reflected by irradiating the substrate with light, and detect that the substrate is present in a case where a time from emission of the light to detection of the light falls within a predetermined time.

Note that the substrate detection sensors 40 to 40h may be substituted by one image sensor that has a field of view for all these modules and robots, or may be substituted by a plurality of image sensors in a case where the position of the substrate is monitored by the plurality of image sensors.

Note that in a case where a first module used in a substrate processing process and a second module used in a substrate processing process after the first module are used among the above-described modules or robots, a substrate detection sensor that detects the presence or absence of the substrate in the first module may be referred to as a first substrate detection sensor, and a substrate detection sensor that detects the presence or absence of the substrate in the second module may be referred to as a second substrate detection sensor.

Figure 2:
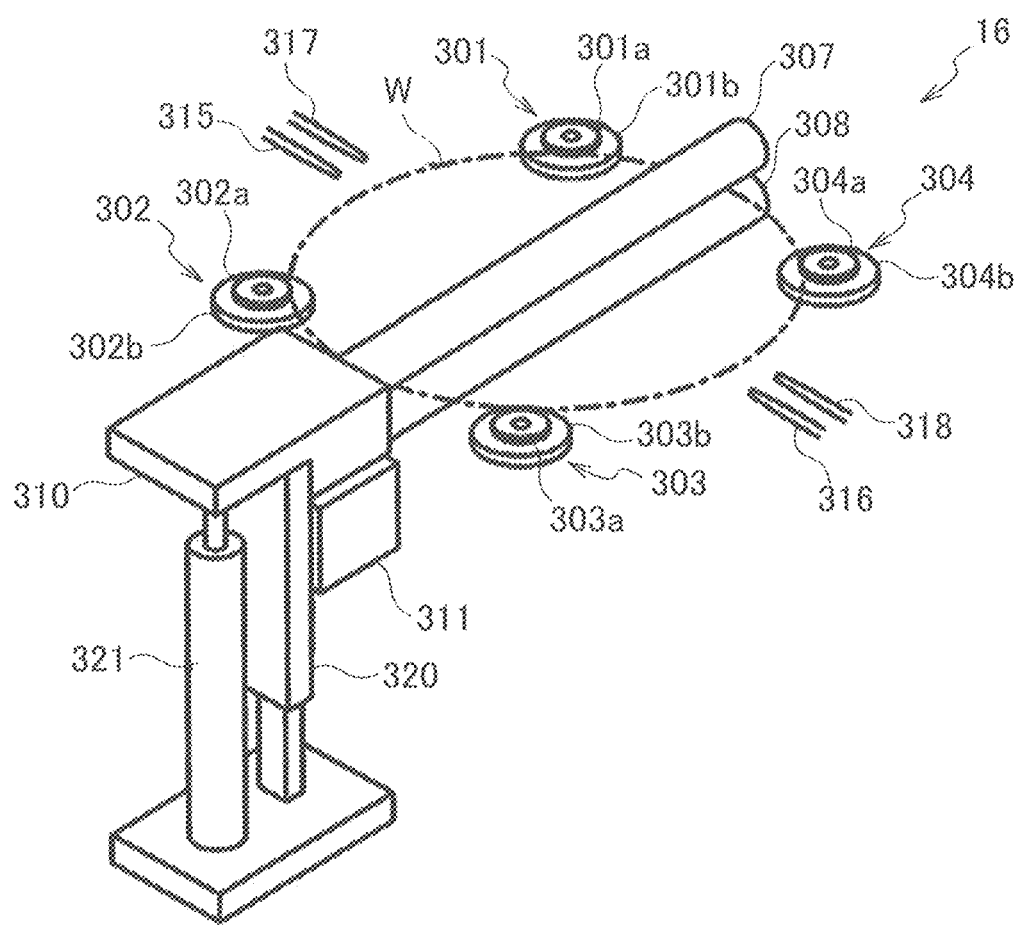
FIG. 2 is a perspective view illustrating one aspect of a first cleaning module.

FIG. 2 is a perspective view illustrating one aspect of the first cleaning module. As illustrated in FIG. 2, the first cleaning module 16 includes rollers 301 to 304 that horizontally holds and rotates the substrate W so that a principal surface faces upward (becomes an upper surface), sponge members 307, 308 that are in contact with the upper surface and a lower surface of the substrate W, respectively, sponge member rotation mechanisms 310, 311 that rotate the sponge members 307, 308, respectively, cleaning liquid nozzles 315, 316 that supply cleaning liquid to the upper surface and the lower surface of the substrate W, respectively, and rinse liquid nozzles 317, 318 that supply rinse liquid to the upper surface and the lower surface of the substrate W, respectively. Note that, in another embodiment, the substrate W may be held vertically.

The rollers 301 to 304 are movable in directions of approaching and separating from each other by a driving mechanism (for example, an air cylinder not illustrated), and each of the rollers has a two-stage configuration of holding parts 301a to 304a and shoulder parts (support parts) 301b to 304b. A diameter of each of the shoulder parts 301b to 304b is larger than a diameter of each of the holding parts 301a to 304a, and the holding parts 301a to 304a are formed on the shoulder parts 301b to 304b, respectively. The substrate W is first placed horizontally on the shoulder parts 301b to 304b, and then held by the holding parts 301a to 304a by the rollers 301 to 304 moving toward the substrate W. At least one of the rollers 301 to 304 is configured to rotate by a rotation mechanism (for example, a spindle not illustrated), whereby the substrate W rotates in a held state.

The shoulder parts 301b to 304b are tapered surfaces inclined downward, and the substrate W is kept in non-contact with the shoulder parts 301b to 304b while being held by the holding parts 301a to 304a. The sponge member rotation mechanism 310 is attached to a guide rail 320 that defines the movement in a vertical direction, is supported by a lifting mechanism 321, and is moved in the vertical direction by the lifting mechanism 321. The lifting mechanism 321 is, for example, a motor driving mechanism using a ball screw or an air cylinder. Similarly, the sponge member rotating mechanism 311 is moved in the vertical direction by a guide rail and a lifting mechanism (not illustrated).

Figure 3:
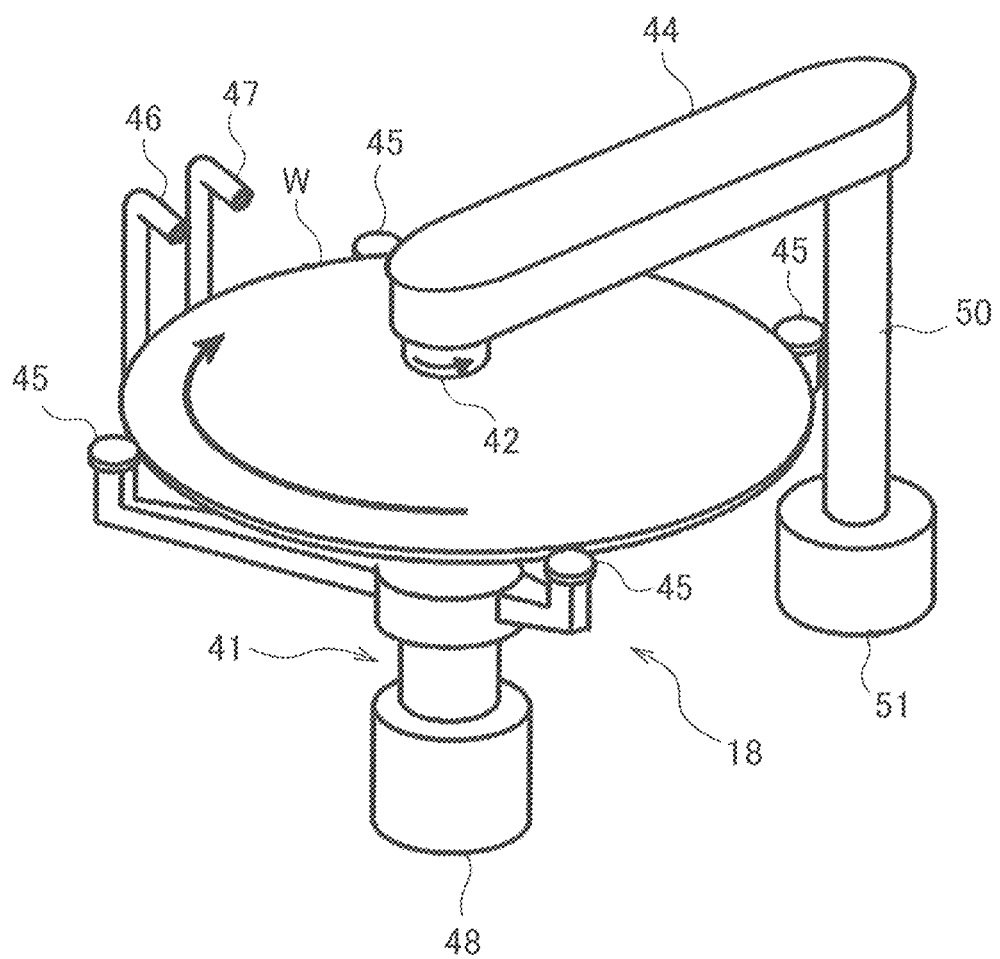
FIG. 3 is a perspective view illustrating one aspect of a second cleaning module.

FIG. 3 is a perspective view illustrating one aspect of the second cleaning module. As illustrated in FIG. 3, the second cleaning module 18 includes a substrate holding and rotating mechanism 41 that horizontally holds and rotates the substrate W such that the principal surface faces upward (becomes an upper surface), a sponge member 42 that is in contact with the upper surface of the substrate W, an arm 44 that holds the sponge member 42, a rinse liquid nozzle 46 that supplies a rinse liquid to the upper surface of the substrate W, and a cleaning liquid nozzle 47 that supplies a cleaning liquid to the upper surface of the substrate W. The substrate holding and rotating mechanism 41 includes a plurality of (four in FIG. 3) chucks 45 that hold a peripheral edge part of the substrate W, and a motor 48 connected to the chucks 45. Each of the chucks 45 is, for example, a spring type clamp mechanism, and holds the substrate W horizontally, and in this state, the substrate W is rotated about a central axis thereof by the motor 48. Note that, in another embodiment, the substrate W may be held vertically. The arm 44 is disposed above the substrate W. The sponge member 42 is connected to one end of the arm 44, and a turning shaft 50 is connected to the other end of the arm 44. Moreover, a cleaning tool moving mechanism 51 for turning the arm 44 is connected to the turning shaft 50. The cleaning tool moving mechanism 51 rotates the turning shaft 50 by a predetermined angle to turn the arm 44 in a plane parallel to the substrate W. The sponge member 42 moves in a radial direction of the substrate W by the turning of the arm 44. Moreover, the cleaning tool moving mechanism 51 can press the sponge member 42 against the upper surface of the substrate W with a predetermined pressure by moving the turning shaft 50 up and down.

Figure 4:
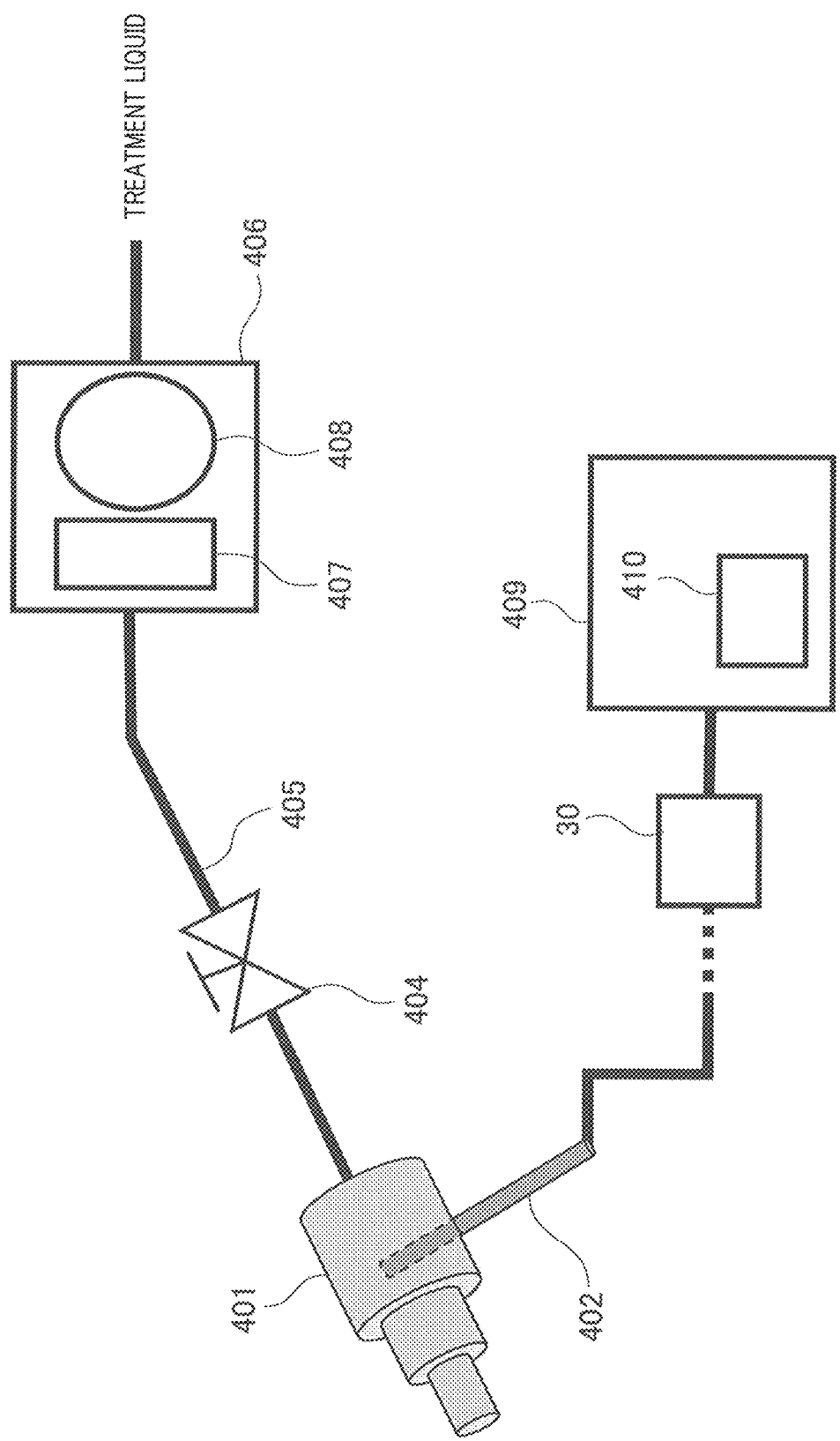
FIG. 4 is a schematic diagram illustrating an example of a cleaning liquid nozzle (315, 316, 47) or a rinse liquid nozzle (317, 318, 46) in FIG. 2 or 3.

FIG. 4 is a schematic diagram illustrating an example of a cleaning liquid nozzle (315, 316, 47) or a rinse liquid nozzle (317, 318, 46) in FIG. 2 or 3. The cleaning liquid nozzle (315, 316, 47) or the rinse liquid nozzle (317, 318, 46) includes a nozzle 401, and supplies a heated (or normal temperature) treatment liquid to the substrate by discharging the heated (or normal temperature) treatment liquid (for example, cleaning liquid or rinse liquid) from the nozzle 401. Here, both the cleaning liquid and the rinse liquid may be heated to a temperature higher than room temperature, or only the cleaning liquid may be heated to room temperature or higher and the rinse liquid may be at room temperature. The nozzle 401 is connected to a cleaning liquid (or rinse liquid) supply pipe 405.

Moreover, the cleaning liquid nozzle (315, 316, 47) or the rinse liquid nozzle (317, 318, 46) includes an electromagnetic valve 404 as an example of a valve that can be controlled to open and close in the cleaning liquid (or rinse liquid) supply pipe. The electromagnetic valve 404 controls a timing of supplying the cleaning liquid (or rinse liquid) to the nozzle 401 by an opening and closing operation based on a control signal transmitted from the controller 30.

As an example, the nozzle 401 is provided with a thermocouple 402 that measures a liquid temperature in the nozzle as an example of a temperature detector that detects a temperature of the treatment liquid inside the nozzle or a temperature of the nozzle. The thermocouple 402 is connected to the controller 30. Therefore, when the cleaning liquid (or the rinse liquid) in the nozzle 401 falls below a target set temperature T1, the controller 30 performs the dispensing of opening the electromagnetic valve 404 and closing the electromagnetic valve 404 when the cleaning liquid (or the rinse liquid) rises to the target set temperature T1, whereby the liquid temperature can be kept constant in a predetermined temperature range.

The controller 30 controls discharge of the target treatment liquid from the nozzle 401 (that is, controls dispensing) according to the temperature (For example, the temperature of the treatment liquid inside the nozzle 401 or the temperature of the nozzle 401 is detected.) detected by the thermocouple 402 as an example of the temperature detector and a position of the substrate. In one embodiment, the controller 30 is configured to generate an operation signal specifying a timing to start discharging, in other words, ejection, the target treatment liquid from the nozzle 401, transmit the operation signal to a valve communicating with the nozzle 401, for example, the electromagnetic valve 404 in one embodiment, and control a timing to open the electromagnetic valve 404 from the closed state by the operation signal, whereby the controller 30 can control the discharging (dispensing start timing) of the target treatment liquid. Here, the target treatment liquid is a treatment liquid to be subjected to temperature control, and is supplied from, for example, a tank held at a temperature higher than normal temperature. In one embodiment, the controller 30 generates an operation signal to change the dispensing timing when the cleaning liquid (or rinse liquid) in the nozzle 401 exceeds or falls below a lower limit set temperature T2. Note that the lower limit set temperature T2 can be arbitrarily set (T2<T1, setting example: T2=60% of T1).

When the temperature exceeds the lower limit set temperature T2, it is determined that the time required for dispensing is short, and the controller 30 opens the electromagnetic valve 404 to execute dispensing at a timing when information indicating that the substrate has run out of the first module (For example, when dispensing is performed by the first cleaning module 16, any one of the polishing modules 14a to 14d) on which immediately preceding processing is being performed is acquired from the substrate detection sensor provided in the first module.

On the other hand, when the temperature is lower than the lower limit set temperature T2, it is determined that the time required for dispensing is long, and the controller 30 opens the electromagnetic valve 404 to execute dispensing at a timing when the information indicating that the substrate has been conveyed to the first module to be subjected to the immediately preceding processing is acquired from the substrate detection sensor provided in the first module.

Therefore, even if the cleaning liquid (or rinse liquid) in the nozzle 401 before dispensing is at any temperature, the liquid temperature to be supplied to the substrate is kept constant by optimally controlling the dispensing timing.

In addition to the substrate detection, a polishing step during the polishing process and a cleaning step during the cleaning process can be referred to as the dispensing timing.

The cleaning liquid nozzle (315, 316, 47) or the rinse liquid nozzle (317, 318, 46) further includes the supply pipe 405 having one end communicating with the nozzle 401 and to which the treatment liquid (for example, cleaning liquid, rinse liquid) is supplied from the other end, the electromagnetic valve 404 provided in the supply pipe 405, and a supply module 406 provided in the supply pipe 405. Here, the thermocouple 402 is an example of a temperature detector that detects the temperature of the target treatment liquid (for example, cleaning liquid, rinse liquid) inside the nozzle 401 or the temperature of the nozzle 401.

The supply module 406 discharges the target treatment liquid to the nozzle 401. Here, the supply module 406 includes a heater 407 (for example, an infrared lamp heater) that heats the treatment liquid, and a diaphragm pump 408 that discharges the target treatment liquid obtained by heating by the heater 407 to the nozzle 401. Note that the target treatment liquid is not limited to being heated by the heater 407, and the target treatment liquid may be stored in a tank, and the target treatment liquid may be directly supplied from the tank to the nozzle 401. In this case, the target treatment liquid may be supplied to the nozzle 401 at a pressure increased in the tank without the supply module 406, or when the supply module 406 is provided, the supply module 406 may or may not include the heater 407 (for example, an infrared lamp heater).

Figure 5:
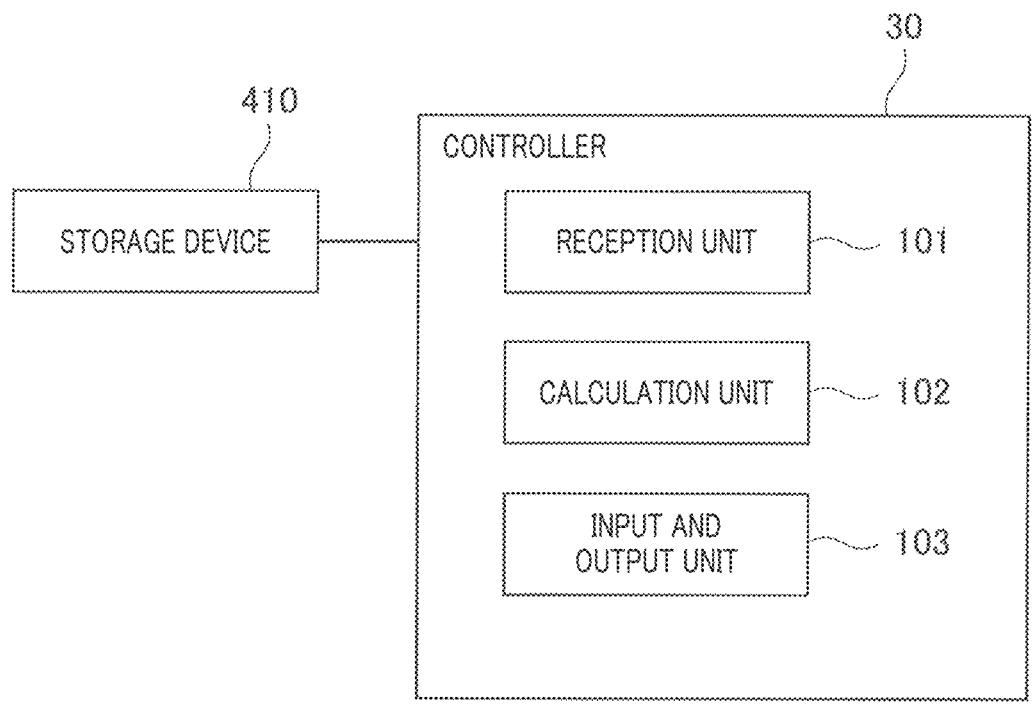
FIG. 5 is a block diagram illustrating an example of a schematic configuration of a controller 30.

The controller 30 is connected to the thermocouple 402 via wiring, and receives a temperature detection signal including information on a temperature detected by the thermocouple 402. The controller 30 is connected to, for example, a database server 409, and the database server 409 is provided with a storage device 410 in which a database is stored. Note that a position of the controller 30 is not limited to the position in FIG. 1, and may be provided, for example, on an upper part of the substrate processing apparatus. The controller 30 is a controller, and may be implemented by, for example, a central processing unit (CPU), a micro processing unit (MPU), or the like executing various programs stored in a storage device inside an information providing device using a RAM as a work area. Furthermore, the controller 30 is a controller, and may be realized by, for example, an integrated circuit such as an application specific integrated circuit (ASIC) or a field programmable gate array (FPGA). FIG. 5 is a block diagram illustrating an example of a schematic configuration of the controller 30. As illustrated in FIG. 5, the controller 30 includes a reception unit 101, a calculation unit 102, and an input and output unit 103, and realizes or executes a function and an action of information processing described below. The reception unit 101 may receive identification information that indicates a position of the substrate acquired by the substrate detection sensors of the substrate processing apparatus for the substrate to be processed, and is associated with a predetermined substrate ID. Moreover, the reception unit 101 may receive temperature data (sensed temperature data) output from a temperature detector (the thermocouple 402 or the like) that senses the temperature of the treatment liquid in the vicinity of the nozzle during dispensing. A signal from the thermocouple 402 may be received by the reception unit 101 after being converted into data by AD conversion by an encoder. The calculation unit 102 is connected to the storage device 410. With respect to the type of the treatment liquid read from the storage device 410, and the temperature of the treatment liquid in the nozzle, or the temperature of the nozzle, the controller 30 may refer to the data of the target set temperature in addition to a dispensing duration required for the treatment liquid to reach the target set temperature from the temperature, and calculate a timing to open and close an on-off valve of the liquid pipe communicating with the nozzle with reference to the temperature data and the position data of the substrate. More specifically, as described later, in a case where the substrate is provided in the first module, a dispensing duration corresponding to the temperature detected by the temperature detector and the type of the treatment liquid in the second module may be calculated as the dispensing duration, and a dispensing start timing and a dispensing end timing may be acquired from the dispensing duration of the calculation result. Moreover, the input and output unit 103 may generate a control signal for opening and closing the on-off valve (for example, the electromagnetic valve 404) of the liquid pipe communicating with the nozzle on the basis of the dispensing start timing and the dispensing end timing calculated by the calculation unit 102, and transmit the control signal to the on-off valve (for example, the electromagnetic valve 404). In one embodiment, opening and closing of the on-off valve (for example, the electromagnetic valve 404) communicating with the nozzle is controlled based on this signal. Furthermore, in one embodiment, when the controller 30 determines that it is not the timing to start dispensing, the controller 30 may cause the calculation unit 102 to output reference information to be a reference of a timing to start dummy dispensing based on a future time when the temperature decrease of the cleaning liquid is estimated to be less than or equal to a predetermined threshold, and an operator may start the dummy dispensing by manually opening the on-off valve (for example, the electromagnetic valve 404) of the liquid pipe communicating with the nozzle based on the reference information.

Figure 6:
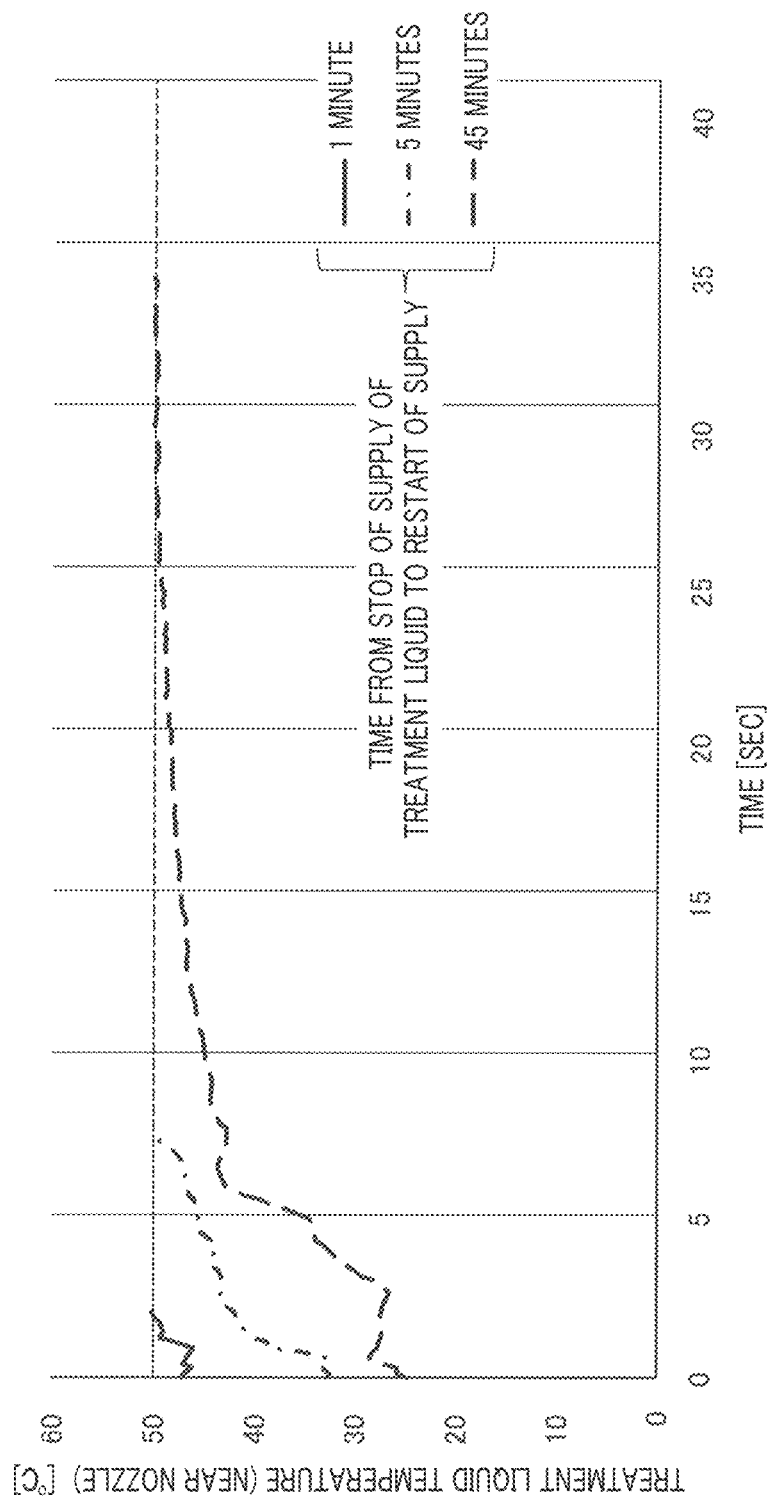
FIG. 6 is a graph illustrating an example of a relationship between a treatment liquid temperature in the vicinity of a nozzle during dispensing and a time after dispensing is resumed.

FIG. 6 is a graph illustrating an example of a relationship between the temperature of the treatment liquid in the vicinity of the nozzle during dispensing and the time after the dispensing is resumed. Each of the graphs of FIG. 6 illustrates a graph after a lapse of 1 minute, a graph after a lapse of 5 minutes, and a graph after a lapse of 45 minutes from the stop of the supply of the treatment liquid to the nozzle 401 to the restart of the supply. Specifically, FIG. 6 is a diagram illustrating a result of a temporal change in liquid temperature (use point) when hot water of 60° C. is supplied again after 1, 5, and 45 minutes have elapsed since the supply of hot water of 60° C. was stopped. At this time, data until the liquid temperature (use point) reached a target temperature 50° C. was analyzed. The measurement method is measurement of radiant heat using a thermographic camera. It was confirmed that the liquid temperature (use point) decreased to about 47° C. in 1 minute, about 32° C. in 5 minutes, and about 24° C. (normal temperature) in 45 minutes from the stop of the hot water supply. When hot water was supplied (dispensed) again, the liquid temperature increased to 50° C. At this time, it took less than 10 seconds for the supplied liquid at 47° C. and 32° C. to rise to 50° C. On the other hand, since it took about 34 seconds for the supplied liquid that had dropped to room temperature to rise to 50° C., it can be confirmed that the time required for dispensing varies greatly depending on the liquid temperature at the time of measurement. That is, as the time from the stop of the supply of the treatment liquid to the nozzle 401 to the restart of dispensing increases, the temperature of the treatment liquid at the time of the restart of dispensing decreases, and the time from the restart of dispensing to when the temperature of the treatment liquid reaches the target temperature (here, 50° C. as an example) increases.

On the other hand, according to the present embodiment, the controller 30 controls discharge (also referred to as dummy dispense) of the target treatment liquid from the nozzle, which is performed before the substrate is conveyed to the target module, according to the temperature (also referred to as liquid temperature) of the treatment liquid detected by the temperature detector (for example, the thermocouple 402) and the position of the substrate. As a result, for example, since the timing of starting dispensing is controlled, the temperature of the treatment liquid discharged for each substrate can be kept constant regardless of the liquid temperature at the time of acquiring the detected temperature. Specifically, for example, in a case where the substrate detection sensor detects that the substrate is positioned in a module (also referred to as a first module) used in a substrate processing process before a target module (also referred to as a second module), discharge (dummy dispense) of the target treatment liquid from the nozzle performed before the substrate is conveyed to the target module is controlled according to the temperature detected by the temperature detector (for example, the thermocouple 402).

As described above, when there is a time from the stop of the supply of the treatment liquid to the nozzle 401 to the restart of the supply, the temperature of the treatment liquid drops during that time. In view of this, control is performed so that the treatment liquid is discharged from the nozzle under the condition that at least the temperature detected by the temperature detector provided in the second module is lower than the target set temperature in the case where the substrate is provided in the first module. As a result, before the second module starts the processing of the substrate, the temperature of the treatment liquid discharged by discharging the treatment liquid while supplying the target treatment liquid to the nozzle in advance can be gradually increased, and when the second module processes the substrate, the temperature of the treatment liquid discharged to the substrate can be kept within a predetermined temperature range, so that it is possible to suppress variations in the processing effect depending on the substrate.

First Processing Example of Dispense Sequence (First Cleaning Module) During Substrate Processing Next, a first processing example of the dispense sequence (first cleaning module) during substrate processing will be described. As described above, the time from the restart of dispensing until the temperature of the treatment liquid reaches the target set temperature T1 varies depending on the time from the stop of the supply of the treatment liquid to the nozzle 401 until the restart of the supply. On the other hand, in the present processing example, the dispensing from the nozzle 401 is continued until the detected temperature detected by the temperature detector reaches the target set temperature T1. As a result, the temperature of the treatment liquid discharged from the nozzle 401 can be finally set to the target set temperature T1.

A dispensing operation sequence according to the embodiment illustrated in FIGS. 1 to 4 will be described with reference to FIG. 7. As a premise, it is assumed that the dispensing operation is performed only during a standby time when the substrate W is not processed. Therefore, when the substrate W is subjected to the cleaning processing or immediately before the cleaning processing is started, the dispensing operation is not performed.

Figure 7:
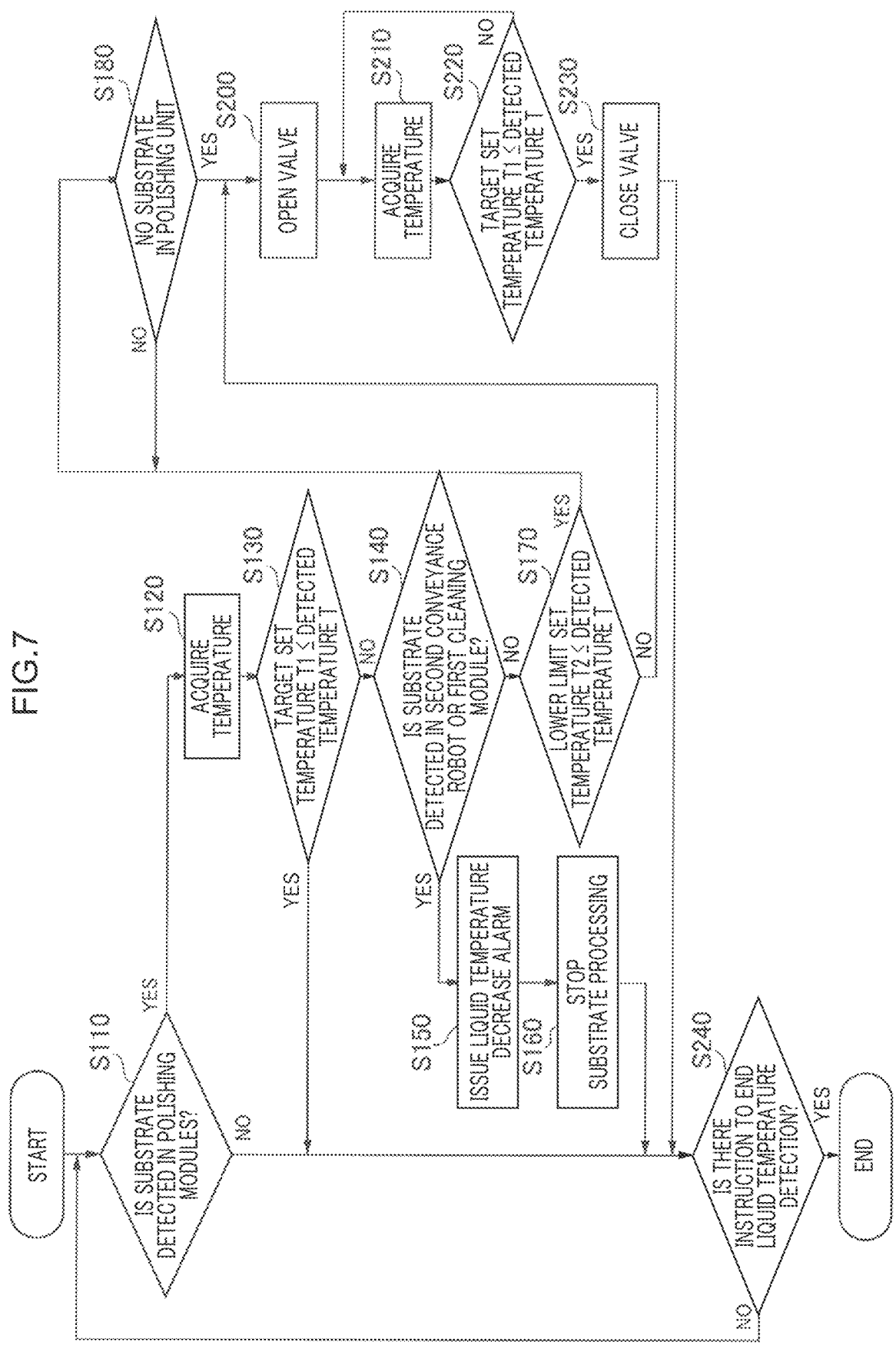
FIG. 7 is a flowchart illustrating a processing example of dummy dispensing in the first cleaning module during substrate processing.

FIG. 7 is a flowchart illustrating a treatment example of the dummy dispensing in the first cleaning module during substrate processing. This dispensing operation sequence is started when the substrate W is conveyed from the load port 12 to the first conveyance robot 22, and at the same time, the thermocouple 402 (or a thermo camera 411 of a modification example described later) starts monitoring the liquid temperature in the nozzle. When the substrate W is detected by any one of the substrate detection sensors 40a to 40d of any one of the polishing modules 14a to 14d (in the case of two-stage polishing, a second-stage polishing module), the controller 30 reads the liquid temperature in the nozzle 401 monitored by the thermocouple 402 (or the thermo camera 411 of the modification example described later). If the value is higher than or equal to the target set temperature T1, since the liquid temperature is maintained at a high temperature, it is determined that appropriate processing can be performed on the substrate W, and dispensing is not performed. As an operation of the controller 30 at that time, the controller 30 keeps the electromagnetic valve 404 closed if the read liquid temperature in the nozzle 401 is higher than or equal to the target set temperature T1.

On the other hand, when the liquid temperature is lower than or equal to the target set temperature T1, the controller 30 determines whether the substrate W is present in the first cleaning module 16 or the second conveyance robot 26 from the substrate detection sensors 40g, 40f. In a case where the substrate W is present in any one or both of the first cleaning module 16 and the second conveyance robot 26, it is regarded that the substrate W is being cleaned or immediately before starting the cleaning, and the controller 30 stops the processing of the substrate W after issuing a liquid temperature decrease alarm.

When the substrate W is not present in either the first cleaning module or the second conveyance robot, the controller 30 compares the read liquid temperature with the lower limit set temperature T2. In a case where the temperature exceeds the lower limit set temperature T2, it is assumed that the time required for dispensing is short, and the controller 30 opens the electromagnetic valve 404 and executes dispensing at the timing when information indicating that the substrate W has disappeared from the polishing module that has performed the immediately preceding processing among the polishing modules 14a to 14d is acquired from the substrate detection sensors 40. On the other hand, when the temperature is lower than the lower limit set temperature T2, it is regarded that the time required for dispensing is long, and the controller 30 opens the electromagnetic valve 404 at that time to execute dispensing. Thereafter, the dispensing is continued by keeping the electromagnetic valve 404 open, and the controller 30 closes the electromagnetic valve 404 and ends the dispensing operation sequence when the temperature becomes higher than or equal to the target set temperature T1.

Here, the target set temperature T1 and the lower limit set temperature T2 can be arbitrarily set. Furthermore, it is also possible to refer to a polishing step during the polishing process and a cleaning step during the cleaning process for the timing of dispensing. Hereinafter, each step of FIG. 7 will be described for each step.

(Step S110) First, the controller 30 determines whether the substrate is detected by a polishing unit 2. In a case where the substrate is not detected by the polishing unit 2, the processing proceeds to step S240.

(Step S120) In a case where it is determined in step S110 that the substrate is detected by the polishing module 14a, the controller 30 acquires the temperature (Hereinafter, referred to as a detected temperature T.) detected by the thermocouple 402 which is an example of the temperature detector. Here, the detected temperature is, for example, the temperature of the treatment liquid inside the nozzle.

(Step S130) After step S120, the controller 30 determines whether or not the detected temperature T is higher than or equal to the target set temperature T1. When the detected temperature T is higher than or equal to the target set temperature T1, the processing proceeds to step S240.

(Step S140) When the detected temperature T is not higher than or equal to the target set temperature T1 in step S130, it is determined whether the substrate is detected by the second conveyance robot 26 or the first cleaning module 16.

(Step S150) When the substrate is detected by the second conveyance robot 26 or the first cleaning module 16 in step S140, the controller 30 issues a liquid temperature decrease alarm. This is because there is no time to raise the treatment liquid since the substrate has already been conveyed to the second conveyance robot 26 or the first cleaning module 16. As described above, when the substrate is detected by the first substrate detection sensor (for example, the substrate detection sensor 40a) provided in the first module (for example, the polishing module 14a) and the temperature detected by the temperature detector is lower than the target set temperature, and when the substrate is detected by the second substrate detection sensor (for example, the substrate detection sensor 40g) provided in the second module (for example, the first cleaning module 16), the controller 30 performs control to issue a notification.

(Step S160) Subsequently to step S150, the controller 30 stops the substrate processing.

(Step S170) When the substrate is not detected by both the second conveyance robot 26 and the first cleaning module 16 in step S140, it is determined whether the detected temperature T is higher than or equal to the lower limit set temperature T2.

(Step S180) In a case where the detected temperature T is higher than or equal to the lower limit set temperature T2 in step S170, the controller 30 determines whether there is no substrate in the polishing unit 2. When the substrate is present in the polishing unit, the controller 30 stands by as it is.

(Step S200) In a case where it is determined in step S180 that there is no substrate in the polishing unit 2, it is considered that the substrate starts to move toward the first cleaning module 16, and the controller 30 opens the electromagnetic valve 404. As a result, the discharge of the treatment liquid from the nozzle 401 is resumed.

When the detected temperature T is lower than the lower limit set temperature T2 in step S170, the controller 30 opens the electromagnetic valve 404. This is because the detected temperature is too low and it takes a relatively long time for the temperature of the treatment liquid to reach the target temperature, so that the discharge of the treatment liquid from the nozzle 401 is restarted without waiting for the substrate to start moving from the polishing unit 2 toward the first cleaning module 16.

(Step S210) Following step S200, the controller 30 again acquires the detected temperature T detected by the thermocouple 402 which is an example of the temperature detector.

(Step S220) Following step S210, the controller 30 determines whether or not the detected temperature T acquired in step S210 is higher than or equal to the target set temperature T1. When the detected temperature T is not higher than or equal to the target set temperature T1, the processing returns to step S210.

(Step S230) When the detected temperature T is higher than or equal to the target set temperature T1 in step S220, the controller 30 closes the electromagnetic valve 404. Then, the processing proceeds to step S240.

(Step S240) The controller 30 determines whether or not there is an instruction to end the liquid temperature detection. When there is no instruction to end the liquid temperature detection, the processing returns to step S110, and the processes in and after step S110 are repeated. On the other hand, when there is an instruction to end the liquid temperature detection, the processing of this flowchart ends.

Note that in the flowchart of FIG. 7, the processing example in the first cleaning module during the substrate processing is exemplified, but similar processing can be implemented in the second cleaning module. In the case of implementing the processing in the second cleaning module, a change may be made such that it is determined in step S110 whether the substrate is detected in the "first cleaning module", it is determined in step S140 whether the substrate is detected in the "second cleaning module", and it is determined in step S180 whether the substrate is not present in the "first cleaning module".

As described above, in a case where the same processing as that in the flowchart of FIG. 7 is realized by the target module, a change may be made such that it is determined in step S110 whether the substrate is detected in the "module in which the substrate processing is performed immediately before the target module", it is determined in step S140 whether the substrate is detected in the "target module", and it is determined in step S180 whether there is no substrate in the "module in which the substrate processing is performed immediately before the target module".

The substrate processing apparatus according to the present embodiment includes a first module used in a substrate processing process, a second module used in a substrate processing process after the first module, and a nozzle provided in the second module and configured to supply a target treatment liquid. Here, for example, when the first module is the polishing unit 2, the second module is, for example, the first cleaning module 16.

As described above, the controller 30 performs control to discharge the target treatment liquid from the nozzle 401 when the temperature detected by the temperature detector (for example, the thermocouple 402) is lower than the target set temperature at the timing when the substrate is detected by the first substrate detection sensor (for example,) assuming that the substrate is provided in the first module. As a result, since the target treatment liquid is discharged from the nozzle 401 in advance, the temperature of the treatment liquid when supplied to the substrate can be increased.

Furthermore, in a case where the second substrate detection sensor that is provided in the second module and detects the presence or absence of the substrate is provided as the substrate detection sensor, and in a case where the temperature detected by the temperature detector at the timing when the substrate is detected by the first substrate detection sensor is lower than the target set temperature and the substrate is not detected by the second substrate detection sensor, the controller 30 performs control to discharge the treatment liquid from the nozzle, for example.

Examples

Figure 8:
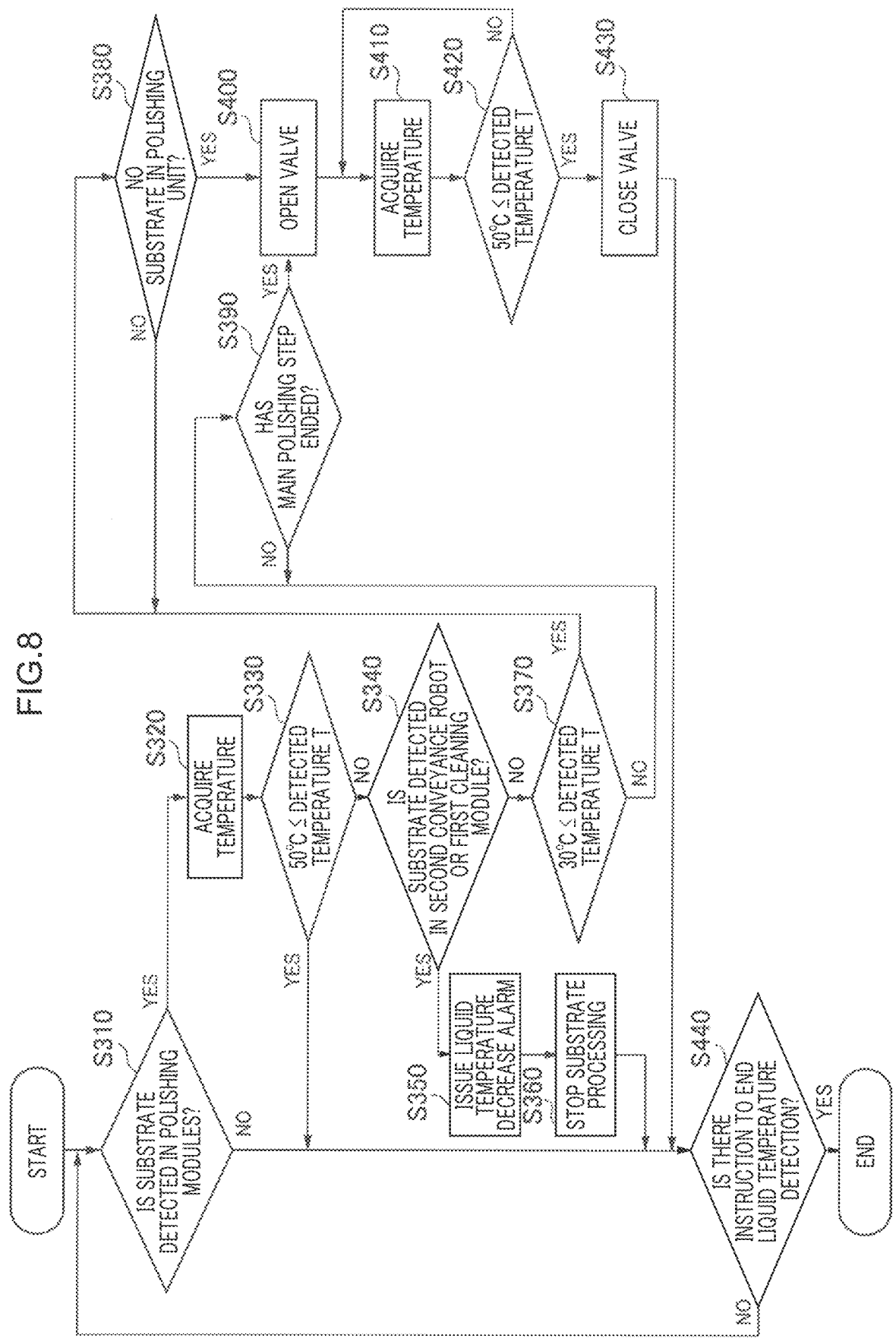
FIG. 8 is a flowchart illustrating a specific example of dummy dispensing processing in the first cleaning module during the substrate processing.

Next, an example is illustrated in FIG. 8. FIG. 8 is a flowchart illustrating a specific example of dummy dispensing processing in the first cleaning module during the substrate processing. In FIG. 8, the target set temperature in FIG. 7 is set to 50° C. as an example, and the lower limit set temperature is set to 30° C. as an example. In FIG. 8, the processing in steps S310 to S370 in FIG. 8 is similar to the processing in steps S110 to S170 in FIG. 7 except for this point, and the processing in steps S380 and S400 to S440 in FIG. 8 is similar to the processing in steps S180 and S200 to S240 in FIG. 7, and thus the detailed description of the processing is omitted. In a case of 30° C.≤T<50° C., the dispensing is set to be started with the fact that the substrate disappears from the polishing module as a trigger, and in a case of T<30° C., the dispensing is set to be started with the fact that the main polishing of the polishing module is finished as a trigger.

Specifically, in FIG. 8, unlike FIG. 7, when the detected temperature T is lower than 30° C., which is an example of the lower limit set temperature T2, in step S370 (step S370 NO), the controller 30 determines whether the main polishing step has ended in step S390 instead of immediately opening the electromagnetic valve 404, and when the main polishing step has ended, the controller 30 opens the electromagnetic valve 404.

Figure 9:
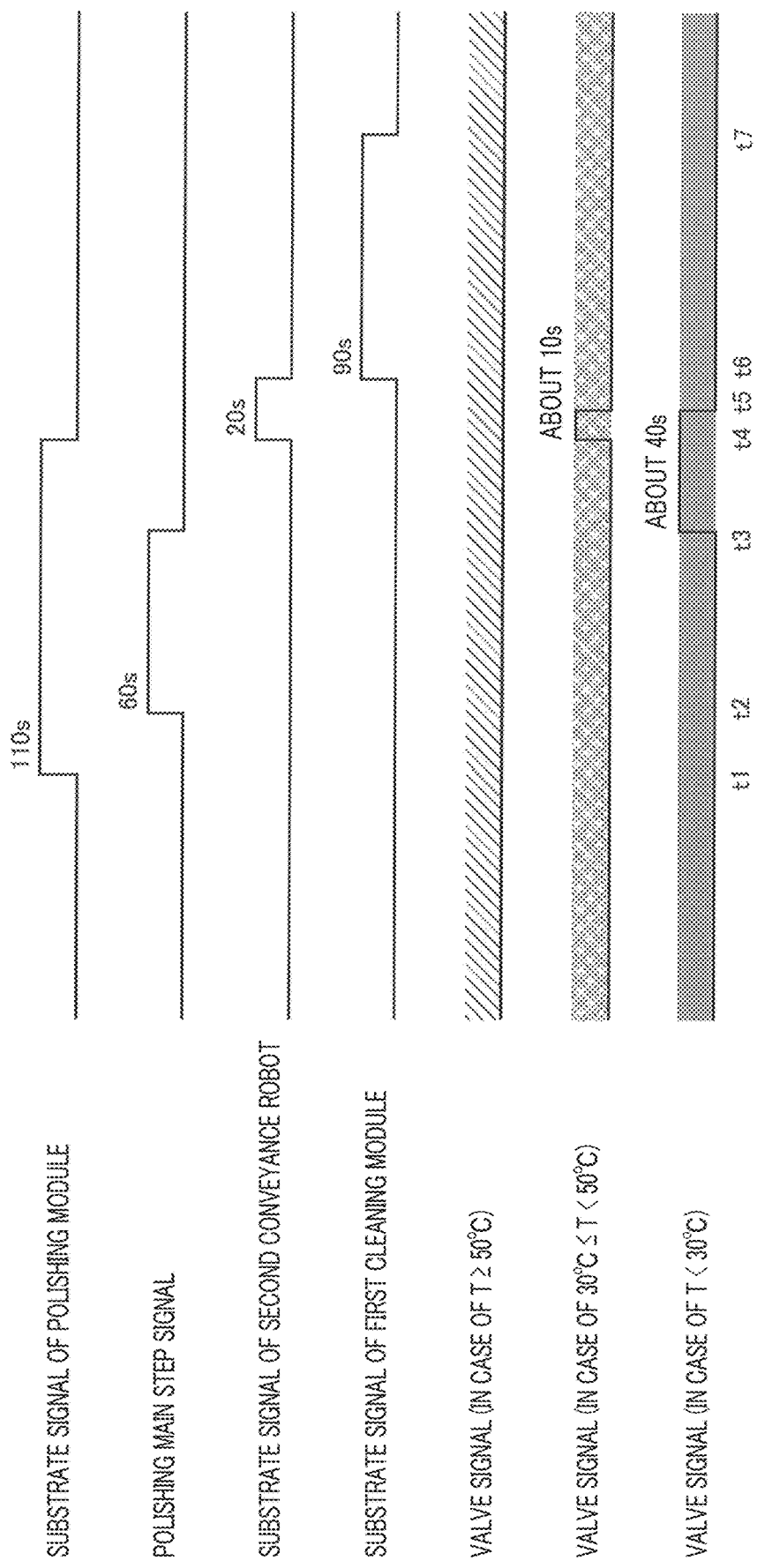
FIG. 9 is an example of a timing chart of each signal in the case of the treatment of FIG. 8.

FIG. 9 is an example of a timing chart of each signal in the case of the processing of FIG. 8. As illustrated in FIG. 9, there are illustrated a substrate signal indicating the presence or absence of a substrate in the polishing module 14a, a polishing main step signal, a substrate signal indicating the presence or absence of a substrate in the second conveyance robot 26, a substrate signal indicating the presence or absence of a substrate in the first cleaning module 16, and three valve signals divided into three cases by detected temperature. The polishing main step signal is a signal representing on/off of the polishing main step. For example, the polishing main step signal becomes a high level when the polishing main step of the polishing module 14a is being executed, and becomes a low level otherwise. As illustrated in FIG. 9, comparing the valve signals in the case of 30° C.≤T<50° C. with the valve signals in the case of T<30° C., the timing at the end of dispensing can be made approximately the same, and the liquid temperature to be supplied to the substrate W can be made constant.

When the substrate is conveyed to the polishing module 14a, the substrate signal indicating the presence or absence of the substrate in the polishing module 14a becomes a high level at time t1, the polishing main step is started at time t2, and the polishing main step signal becomes a high level. If the detected temperature T is lower than 30° C. when the polishing main step is completed at time t3, the valve signal goes to a high level and the valve opens. The valve signal remains open until the detected temperature T reaches 50° C. In this example, the detected temperature T reaches 50° C. at time t5 as an example, the valve signal becomes a low level, and the valve closes.

On the other hand, when the detected temperature T is 30° C. or higher and lower than 50° C. when the polishing main step is completed at time t3, the valve signal does not go to a high level. Thereafter, when the substrate is removed from the polishing module at time t4 and the substrate signal of the polishing module 14a becomes a low level, the valve signal becomes a high level, and when the second conveyance robot 26 holds the substrate, the substrate signal of the second conveyance robot 26 becomes a high level. The valve signal remains open until the detected temperature T reaches 50° C. In this example, the detected temperature T reaches 50° C. at time t5 as an example, the valve signal becomes a low level, and the valve closes.

When the substrate is conveyed from the second conveyance robot 26 to the first cleaning module at time t6, the substrate signal of the second conveyance robot goes to a low level and the substrate signal of the first cleaning module 16 goes to a high level. Thereafter, the substrate is cleaned by the first cleaning module 16.

After the substrate cleaning, when the substrate is removed from the first cleaning module 16 at time t6, the substrate signal of the first cleaning module becomes a low level.

As described above, in a case where the temperature detected by the temperature detector is higher than the target set temperature and the lower limit set temperature lower than the target temperature, the controller 30 performs control to discharge the target treatment liquid from the nozzle at the timing when the substrate is not present in the first module, and in a case where the temperature detected by the temperature detector is lower than the lower limit set temperature, the controller 30 performs control to discharge the target treatment liquid from the nozzle at the "set timing before the processing process ends" in the first module. Here, in the above example, the first module is the polishing module 14a, and the "set timing before the processing process ends" is a timing at which the main polishing step (main polishing process) ends.

According to the present embodiment, the temperature of the treatment liquid inside the nozzle 401 can be monitored. Furthermore, by dispensing the treatment liquid whose temperature has decreased at an optimum timing, the temperature of the treatment liquid discharged from the nozzle 401 can be maintained within a predetermined range based on the target set temperature. Therefore, a substrate processing apparatus and a substrate processing method having good uniformity of the temperature of the treatment liquid for each substrate are provided, and a stable removal effect against particulate contamination, molecular contamination, and metal element contamination is obtained. Furthermore, the controller 30 can suppress wasteful discharge of the treatment liquid or the chemical solution by optimizing the dispense timing according to the temperature detected by the temperature detector.

Note that each processing described above may be applied not only to the treatment liquid of the cleaning module but also to the treatment liquid (for example, a polishing liquid or an atomizer liquid) in the polishing module. As an example, a processing example in the case of the polishing liquid in the polishing module will be described below.

Figure 10:
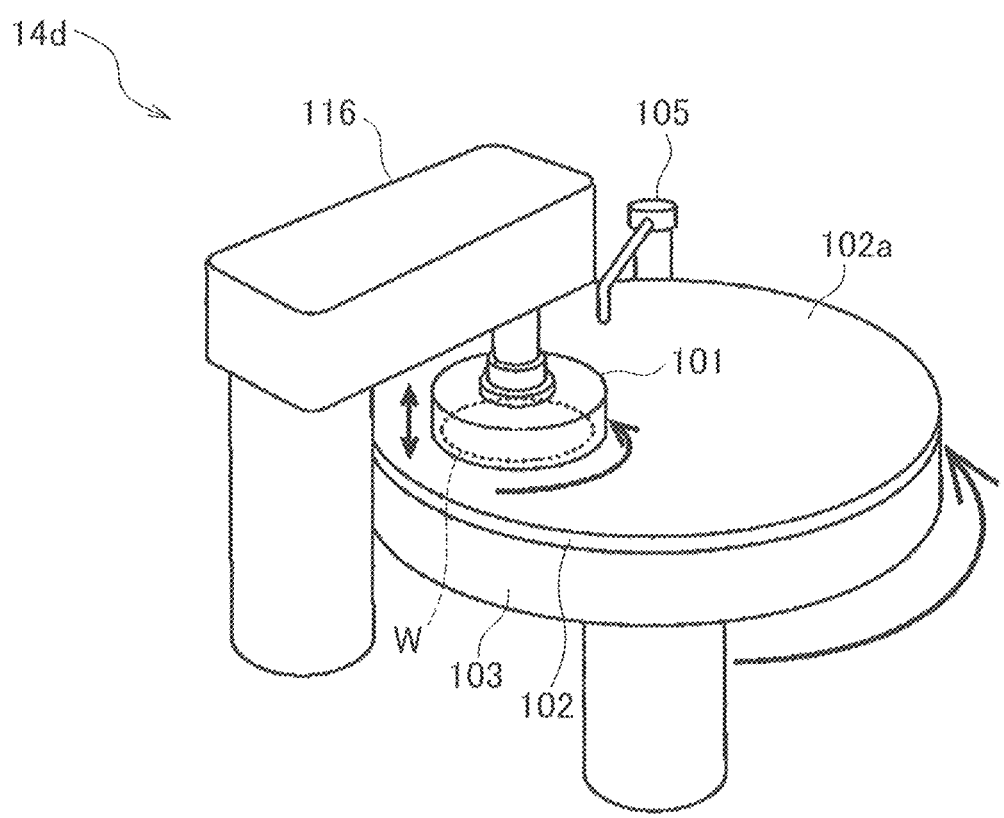
FIG. 10 is a schematic view illustrating a polishing module according to an embodiment of the present invention.

FIG. 10 is a schematic view illustrating a polishing module according to an embodiment of the present invention. Since the configurations of the polishing modules 14a to 14d are the same, the polishing module 14d will be described as a representative. As illustrated in FIG. 10, the polishing module 14d includes a polishing head (substrate holding device) 101 that holds and rotates a wafer W, which is an example of a substrate, a polishing table 103 that supports a polishing pad 102, and a polishing liquid supply nozzle 105 that supplies a polishing liquid (also referred to as an abrasive liquid) to the polishing pad 102.

The polishing head 101 is configured to hold the wafer W on its lower surface by vacuum suction. The polishing head 101 and the polishing table 103 rotate in the same direction as indicated by an arrow, and in this state, the polishing head 101 presses the wafer W against a polishing surface 102a of the polishing pad 102. A polishing liquid is supplied from the polishing liquid supply nozzle 105 onto the polishing pad 102, and the wafer W is polished by sliding contact with the polishing pad 102 in the presence of the polishing liquid. As an example, the configuration of the polishing liquid supply nozzle 105 is similar to the configuration illustrated in FIG. 4. However, this case is different from the case of FIG. 4 in that the treatment liquid is a polishing liquid (abrasive liquid).

The polishing head 101 is configured to be movable between a delivery position and an upper position of the polishing table 103 by turning of a head arm 116. The polishing head 101 receives the wafer W from the conveyance robot 22 at the delivery position, holds the wafer W on the lower surface, moves to a position above the polishing table 103 together with the wafer W, and presses the wafer W against the polishing pad 102 on the polishing table 103.

Figure 11:
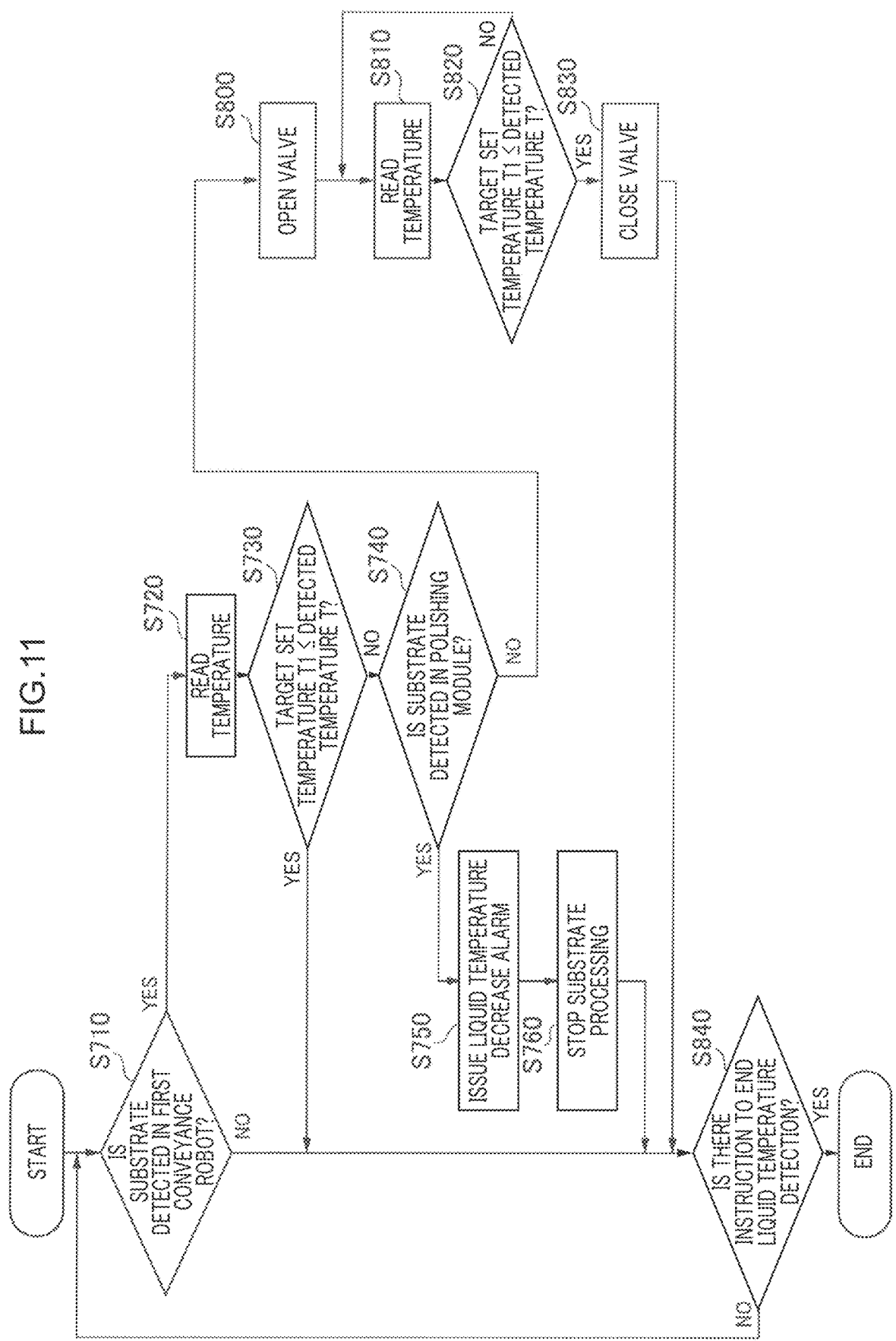
FIG. 11 is a flowchart illustrating a processing example of dummy dispensing in the polishing module during the substrate processing.

FIG. 11 is a flowchart illustrating a processing example of the dummy dispensing in the polishing module during the substrate processing. Hereinafter, each step of FIG. 11 will be described for each step.

(Step S710) First, the controller 30 determines whether the substrate is detected by the first conveyance robot 22. When the substrate is not detected by the first conveyance robot 22, the processing proceeds to step S840.

(Step S720) When it is determined in step S710 that the substrate is detected by the first conveyance robot 22, the controller 30 acquires the detected temperature T which is the temperature detected by the thermocouple of the polishing liquid supply nozzle 105. Here, the detected temperature is, for example, the temperature of the treatment liquid inside the nozzle.

(Step S730) After step S720, the controller 30 determines whether or not the detected temperature T is higher than or equal to the target set temperature T1. When the detected temperature T is higher than or equal to the target set temperature T1, the processing proceeds to step S840.

(Step S740) In a case where the detected temperature T is not higher than or equal to the target set temperature T1 in step S730, it is determined whether the substrate is detected by the polishing module 14a.

(Step S750) When the substrate is detected by the polishing module 14a in step S740, the controller 30 issues a liquid temperature decrease alarm. This is because there is no time to raise the treatment liquid since the substrate has already been conveyed to the polishing module 14a. As described above, in a case where the substrate is detected by the first substrate detection sensor (for example, the substrate detection sensor 40) provided in the first module (in this example, the first conveyance robot 22) and the temperature detected by the temperature detector is lower than the target set temperature, and in a case where the substrate is detected by the second substrate detection sensor (for example, the substrate detection sensor 40a) provided in the second module (in this example, the polishing module 14a), the controller 30 performs control to issue a notification.

(Step S760) Subsequently to step S750, the controller 30 stops the substrate processing.

(Step S800) In a case where the substrate is not detected by the polishing module 14a in step S740, it is assumed that the substrate starts to move toward the polishing module 14a, and the controller 30 opens the electromagnetic valve of the polishing liquid supply nozzle 105. As a result, the discharge of the polishing liquid from the polishing liquid supply nozzle 105 is resumed.

(Step S810) Following step S800, the controller 30 again acquires the detected temperature T detected by the thermocouple of the polishing liquid supply nozzle 105.

(Step S820) Following step S810, the controller 30 determines whether or not the detected temperature T acquired in step S810 is higher than or equal to the target set temperature T1. If the detected temperature T is not higher than or equal to the target set temperature T1, the processing returns to step S810.

(Step S830) When the detected temperature T is higher than or equal to the target set temperature T1 in step S820, the controller 30 closes the electromagnetic valve of the polishing liquid supply nozzle 105. Then, the processing proceeds to step S840.

(Step S840) The controller 30 determines whether or not there is an instruction to end the liquid temperature detection. When there is no instruction to end the liquid temperature detection, the processing returns to step S710, and the processes in and after step S710 are repeated. On the other hand, when there is an instruction to end the liquid temperature detection, the processing of this flowchart ends.

As described above, the substrate processing apparatus according to the present embodiment includes a first module used in a substrate processing process, a second module used in a substrate processing process after the first module, a nozzle provided in the second module and configured to supply a target treatment liquid, a temperature detector that detects a temperature of the treatment liquid inside the nozzle or a temperature of the nozzle, a substrate detection sensor that detects a position of the substrate, and a controller that controls discharge of the target treatment liquid from the nozzle according to the temperature detected by the temperature detector when the substrate detection sensor detects that the substrate is located in the first module.

According to this configuration, before the second module starts the processing, the treatment liquid can be discharged while the target treatment liquid is supplied to the nozzle in advance, and when the second module performs the processing, the temperature of the discharged treatment liquid can be increased and kept within a predetermined temperature range, so that the uniformity of the processing performance for each substrate can be improved.

Figure 12A:
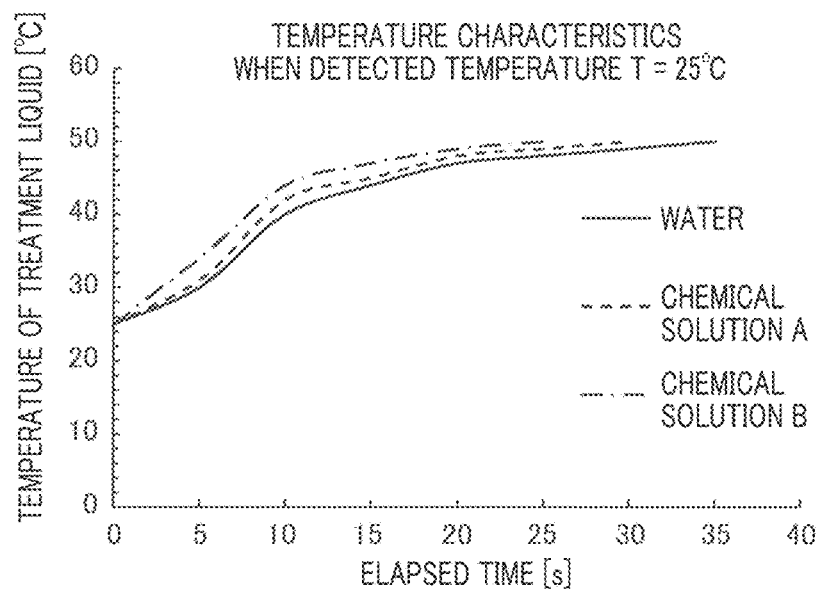
FIG. 12A is a graph illustrating an example of a subsequent change with time of a temperature in a case where an electromagnetic valve is opened when the detected temperature T is 25° C. at time 0.
Figure 12B:
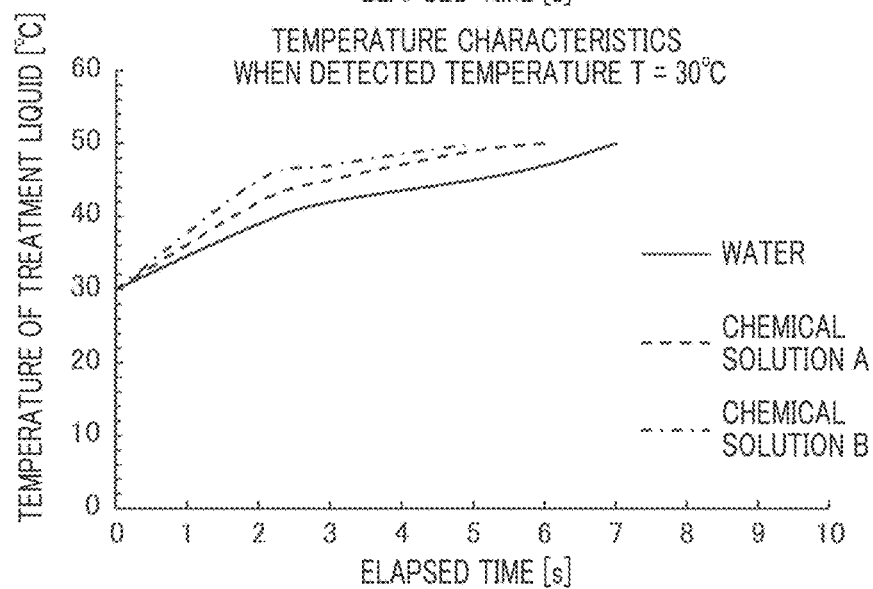
FIG. 12B is a graph illustrating an example of a subsequent change with time of a temperature in a case where the electromagnetic valve is opened when the detected temperature T is 30° C. at time 0.
Figure 12C:
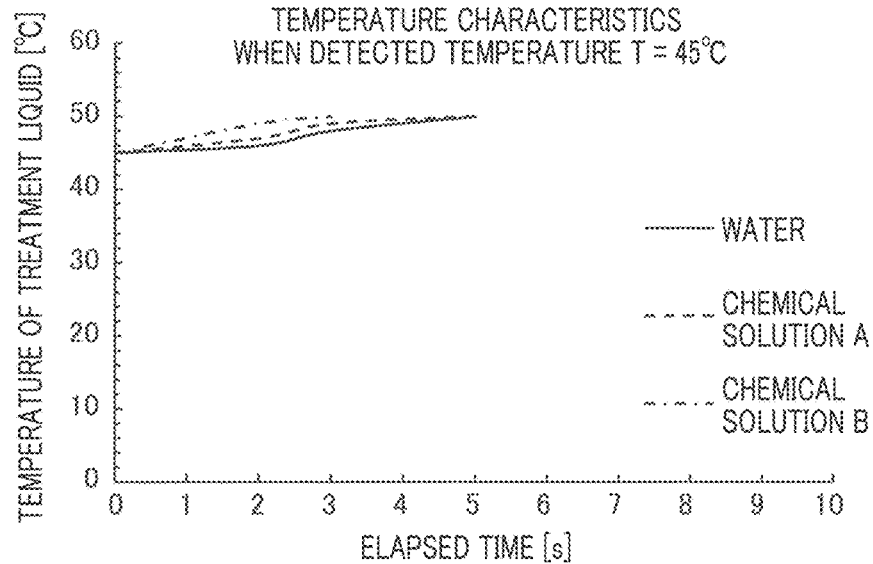
FIG. 12C is a graph illustrating an example of a subsequent change with time of a temperature in a case where the electromagnetic valve is opened when the detected temperature T is 45° C. at time 0.

Second Processing Example of Dispense Sequence (First Cleaning Module) During Substrate Processing Next, a second processing example of the dispense sequence (first cleaning module) during substrate processing will be described. FIG. 12A is a graph illustrating an example of a change with time of the temperature after the electromagnetic valve is opened when the detected temperature T is 25° C. at time 0. FIG. 12B is a graph illustrating an example of a change with time of the temperature after the electromagnetic valve is opened when the detected temperature T is 30° C. at time 0. FIG. 12C is a graph illustrating an example of a change with time of the temperature after the electromagnetic valve is opened when the detected temperature T is 45° C. at time 0. In FIGS. 12A to 12C, the vertical axis represents the temperature of the treatment liquid supplied to the substrate, and the horizontal axis represents the elapsed time from the start of the dummy dispense. Here, the dummy dispense is processing of discharging the treatment liquid before being supplied to the substrate. A solid line indicates water as the treatment liquid, a broken line indicates chemical solution A as the treatment liquid, and a one-dot chain line indicates chemical solution B. A set flow rate of the dispense, a pipe length, and a pipe diameter are determined in advance, and are common to all the treatment liquids in FIGS. 12A to 12C. The time to reach 50° C., which is an example of the target set temperature, varies depending on the temperature at time 0, and the lower the temperature at time 0, the longer the time to reach 50° C.

Figure 13:
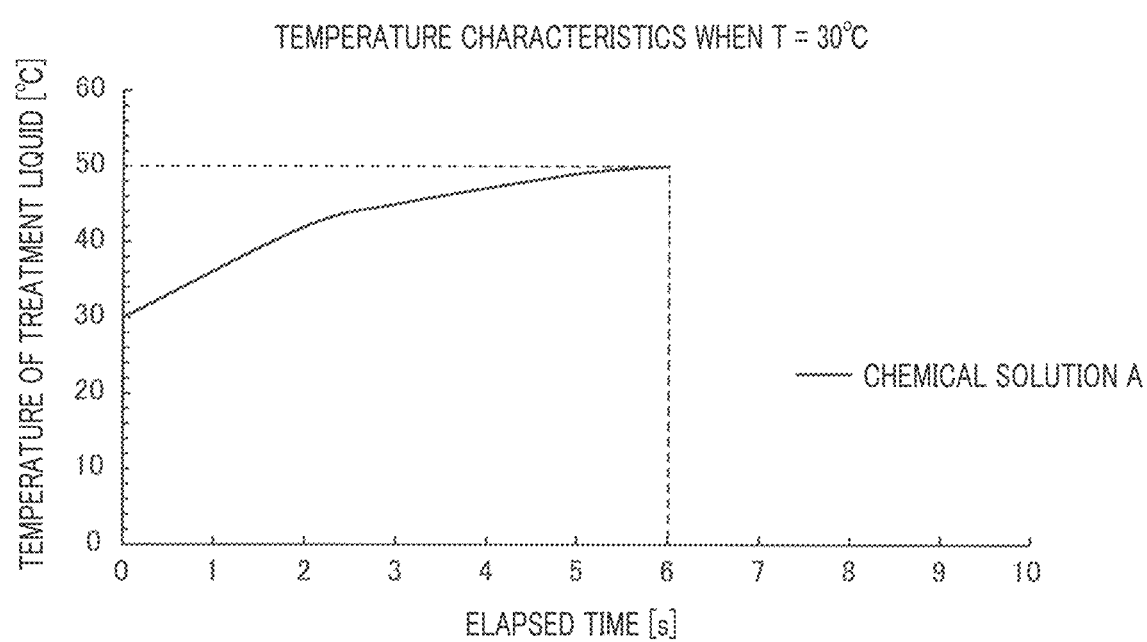
FIG. 13 is a graph illustrating an example of a subsequent change with time of a temperature of a chemical solution A in a case where the electromagnetic valve is opened when the detected temperature T is 30° C. at time 0.

FIG. 13 is a graph illustrating an example of a change with time of the temperature after the electromagnetic valve is opened when the detected temperature T is 30° C. at time 0 for the chemical solution A. In FIG. 13, since the time required for the chemical solution A to reach 50° C., which is an example of the target set temperature, is 6 seconds, the dispensing duration required for the treatment liquid to reach the target set temperature 50° C. from the detected temperature T=30° C. is 6 seconds. This time is a time during which dispensing (dummy dispensing) is continued in advance before the substrate is conveyed to the target module (sometimes referred to as dummy dispensing duration).

FIG. 14 is an example of a table of a database constructed in the storage device 410. Note that, in the example of FIG. 14, as an example, it is assumed that one target set temperature is determined in advance. A table TB1-W stores a record of a set of the temperature of the treatment liquid in the nozzle (or the temperature of the nozzle) and the dispensing duration required for the treatment liquid to reach the target set temperature from the temperature when the treatment liquid is water. Similarly, a table TB1-A stores a record of a set of the temperature of the treatment liquid in the nozzle or the temperature of the nozzle when the treatment liquid is the chemical solution A, and the dispensing duration required for the treatment liquid to reach the target set temperature from the temperature. Similarly, a table TB1-B stores a record of a set of the temperature of the treatment liquid in the nozzle or the temperature of the nozzle when the treatment liquid is the chemical solution B, and the dispensing duration required for the treatment liquid to reach the target set temperature from the temperature.

As described above, the storage device 410 stores the dispensing duration required for the treatment liquid to reach the target set temperature from the temperature for each temperature of the treatment liquid in the nozzle or each temperature of the nozzle.

The controller 30 according to one aspect determines the execution timing and duration of the dummy dispense according to the temperature detected by the temperature detector (that is, the temperature of the treatment liquid), and performs control to discharge the target treatment liquid from the nozzle at the execution timing and duration of the dummy dispense.

Specifically, for example, the controller 30 acquires, from the storage device 410, "the dummy dispensing duration required to reach the target set temperature" corresponding to the temperature of the treatment liquid detected by the temperature detector (for example, the thermocouple 402) when the substrate detection sensor detects that the substrate is located in the first module (for example, the polishing module 14*a*). Then, the controller 30 performs control to discharge the treatment liquid from the nozzle 401 for the dispensing duration or longer from a time earlier than a predicted substrate processing start time in the second module (for example, the first cleaning module 16) by the dispensing duration or longer. As a result, it is possible to discharge the treatment liquid at the target set temperature from the nozzle 401 at the start of the substrate processing in the second module (for example, the first cleaning module 16).

As illustrated in FIG. 14, in the storage device 410 according to one aspect, a type of the treatment liquid (also referred to as a liquid type), and a temperature of the treatment liquid in the nozzle or a temperature of the nozzle is stored in association with a target set temperature in addition to a dispensing duration required for the treatment liquid to reach the target set temperature from the temperature. The controller 30 may read the temperature detected by the temperature detector in a case where the substrate is provided in the first module (for example, the polishing module 14a) and the dispensing duration corresponding to the type of the treatment liquid in the second module (for example, the first cleaning module 16) from the storage device 410 as the dispensing duration.

Similarly, the user may select (or set) the target set temperature, the set dispense flow rate, the pipe length, and the pipe diameter. Note that instead of a set of the pipe length and the pipe diameter, an in-pipe volume may be selectable, and it is sufficient that a volume of the liquid retained in the supply pipe 405 can be specified. In this case, dispensing durations corresponding to the processing conditions (The processing conditions may include a detected temperature, a target set temperature, a liquid type, a set flow rate of dispensing, and a pipe length.) are associated and stored.

In this case, the controller 30 acquires the dispensing durations corresponding to the processing conditions (The processing conditions may include a detected temperature, a target set temperature, a liquid type, a set flow rate of dispensing, and a pipe length.) as the dummy dispensing duration from the storage device 410 of the database server 409. As a result, the optimum dummy dispensing duration can be applied.

At this time, the input information to the controller 30 is the temperature of the treatment liquid, the target set temperature (However, if one is determined, it is unnecessary.), the liquid type (However, if one is determined, it is unnecessary.), the set flow rate of the dispensing (However, if one is determined, it is unnecessary.), the pipe length (However, if one is determined, it is unnecessary.), and the pipe diameter (However, if one is determined, it is unnecessary.), and output information is the dummy dispensing duration. The controller 30 performs control to discharge the treatment liquid from the nozzle 401 for the dispensing duration or longer from a time earlier than a predicted substrate processing start time in the second module (for example, the first cleaning module 16) by the dispensing duration or longer (specifically, for example, the electromagnetic valve 404 is opened).

FIG. 15 is an example of a table stored in the storage device 410. In a table TB2 of FIG. 15, a record of a set of a module name which is an example of information for identifying a module and a standard processing time of the module is stored. For example, the standard processing time is different among the polishing module 14a, the first cleaning module 16, and the second cleaning module 18. For example, the controller 30 refers to the table TB2 of the storage device 410 to read a standard processing time corresponding to each module, and controls the module to execute processing (for example, polishing or cleaning) in the standard processing time.

Figure 16:
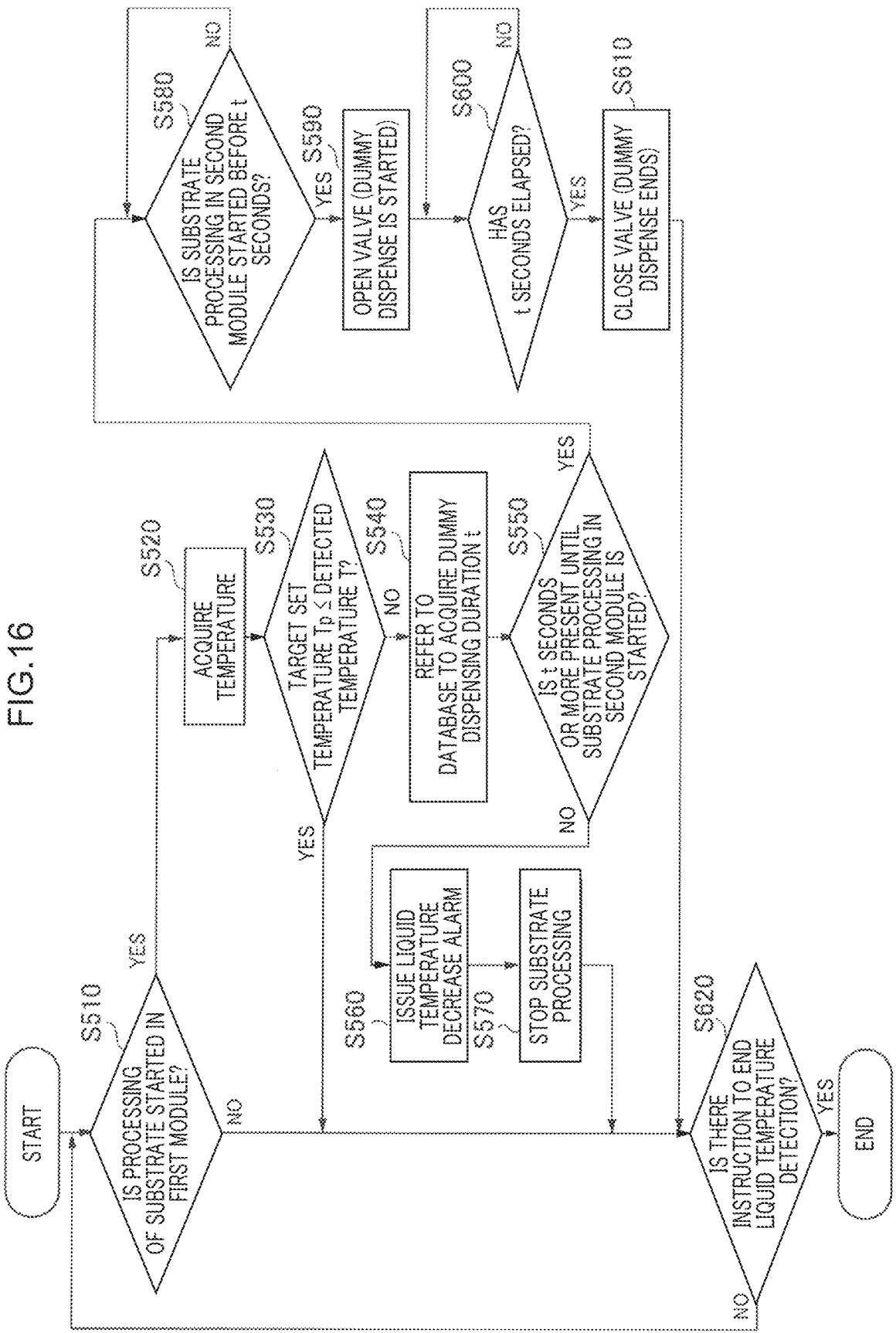
FIG. 16 is a flowchart illustrating another processing example of dummy dispensing in the second module during the substrate processing.

FIG. 16 is a flowchart illustrating another processing example of the dummy dispense in the second module during the substrate processing. In the processing of FIG. 16, for example, in a case where the substrate processing is started in the first module (used in the substrate processing process before the second module), the controller 30 acquires the temperature at the use point (for example, the nozzle 401). When an acquired detected temperature T is lower than a target set temperature Tp, the controller 30 acquires the dispensing duration corresponding to the processing condition (detected temperature T/target set temperature Tp/treatment liquid type) as the dummy dispensing duration t from the database of the storage device 410. As a result, the optimum dummy dispensing duration can be acquired.

Thereafter, it is determined whether the time until the substrate processing in the second module (module for performing temperature control) starts is longer than or equal to the dummy dispensing duration t (seconds). At this time, in a case where the time until the start of the substrate processing is less than or equal to the dummy dispensing duration t (seconds), it is regarded that it is too late for the temperature of the treatment liquid to rise to the target set temperature, and the controller 30 issues a liquid temperature decrease alarm and stops the processing of the substrate. On the other hand, in a case where the time until the start of the substrate processing is longer than or equal to the dummy dispensing duration t (seconds), for example, the controller 30 waits until t seconds before the processing in the second module is started, and opens the electromagnetic valve 404 to start the dummy dispense at the timing t seconds before. Thereafter, for example, the controller 30 closes the electromagnetic valve 404 after the dummy dispensing duration t (seconds) and ends the dummy dispense.

Hereinafter, each step of FIG. 16 will be described for each step. As described above, the second module is used in the substrate processing process after the first module.

(Step S510) The controller 30 determines whether or not the processing of the substrate is started in the first module. Specifically, for example, the controller 30 considers that the substrate processing is started when the substrate detection sensor provided in the first module detects the substrate.

(Step S520) The controller 30 acquires the detected temperature T of the temperature detector (for example, the thermocouple 402).

(Step S530) The controller 30 determines whether or not the detected temperature T is higher than or equal to the target set temperature Tp. When the detected temperature T is higher than or equal to the target set temperature Tp, the processing proceeds to step S620.

(Step S540) When the detected temperature T is not higher than or equal to the target set temperature Tp in step S530, the controller 30 refers to the database of the storage device 410 to acquire the dummy dispensing duration t.

(Step S550) Next to step S540, the controller 30 determines whether or not the dummy dispensing duration t (seconds) or more is present until the substrate processing in the second module is started.

(Step S560) When the time until the start of the substrate processing in the second module is not longer than or equal to the dummy dispensing duration t (sec) in step S550, the controller 30 issues a liquid temperature decrease alarm.

(Step S570) Next to step S550, the controller 30 stops processing the substrate. Thereafter, the processing proceeds to step S620.

(Step S580) When the dummy dispensing duration t (seconds) or more is present until the substrate processing in the second module is started in step S550, the controller 30 determines whether or not the substrate processing in the second module is started before the dummy dispensing duration t (seconds). The controller 30 waits until the start of substrate processing in the second module is before the dummy dispensing duration t (seconds).

(Step S590) When the substrate processing start in the second module is before the dummy dispensing duration t (seconds) in step S580, the controller 30 opens the electromagnetic valve 404. As a result, the dummy dispense is started.

(Step S600) The controller 30 determines whether or not the dummy dispensing duration t (seconds) has elapsed from the opening of the electromagnetic valve 404 (that is, the start of the dummy dispense). The controller 30 waits until the dummy dispensing duration t (seconds) elapses after the electromagnetic valve 404 is opened.

(Step S610) When the dummy dispensing duration t (seconds) has elapsed since the opening of the electromagnetic valve 404 in step S600, the controller 30 closes the electromagnetic valve 404. As a result, the dummy dispense ends. Thereafter, the processing proceeds to step S620.

(Step S620) The controller 30 determines whether or not there is an instruction to end the liquid temperature detection. When there is no instruction to end the liquid temperature detection, the processing returns to step S510, and the processes in and after step S510 are repeated. When there is an instruction to end the liquid temperature detection, the processing of this flowchart is ended.

Modification Example of Temperature Detector

Figure 17:
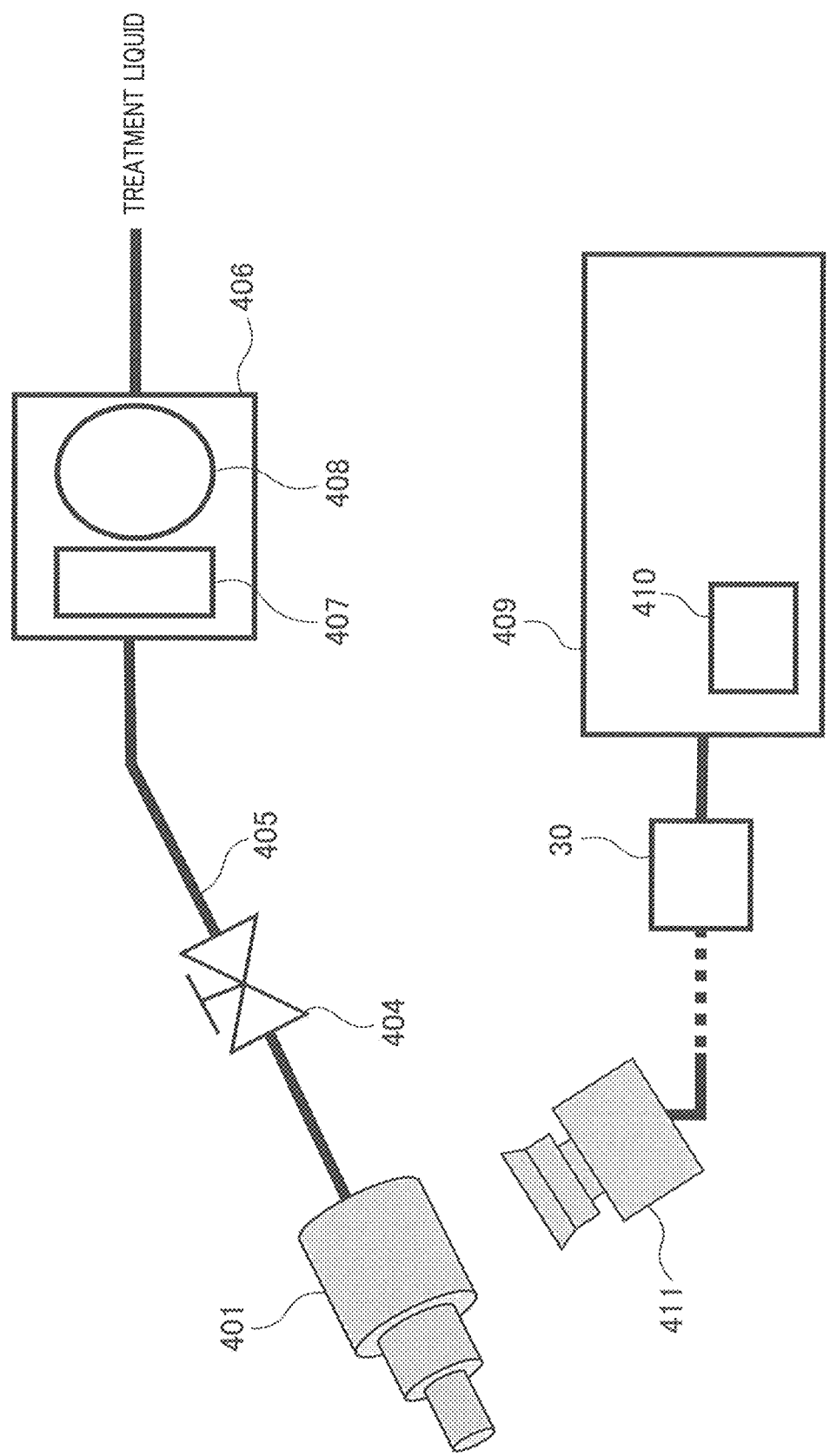
FIG. 17 is a schematic diagram illustrating a modification example of the cleaning liquid nozzle (315, 316, 47) or the rinse liquid nozzle (317, 318, 46) in FIG. 2 or 3.

FIG. 17 is a schematic diagram illustrating a modification example of the cleaning liquid nozzle (315, 316, 47) or the rinse liquid nozzle (317, 318, 46) in FIG. 2 or 3. In FIG. 17, the thermocouple 402 in FIG. 4 is used as a thermo camera 411 as a temperature detector. The thermocouple 402 of FIG. 4 detects the temperature of the treatment liquid inside the nozzle. Here, the thermo camera 411 detects the temperature of the treatment liquid inside the nozzle 401.

Note that the thermocouple 402 and the thermo camera 411 may detect the temperature of the nozzle 401 instead of the temperature of the treatment liquid inside the nozzle. In this case, the controller 30 may use a correlation between the temperature of the nozzle 401 and the temperature of the treatment liquid inside the nozzle 401 to perform control based on the temperature of the nozzle 401 such that the temperature of the treatment liquid inside the nozzle 401 falls within a predetermined range based on the target set temperature.

Note that the technique of each processing of the present embodiment can be applied not only to the polishing apparatus but also to a wet process apparatus that performs processing while controlling the liquid temperature of the treatment liquid with high accuracy when a plurality of substrates are continuously subjected to single-wafer processing. More specifically, the present technology can also be applied to supply timing control of a treatment liquid in a substrate plating apparatus for plating a substrate, a substrate bevel polishing apparatus, a substrate entire back surface polishing apparatus, a wet etching apparatus for treating a substrate with an etching liquid, a resist stripping apparatus for stripping a resist from a substrate, and a developing apparatus for developing a substrate.

Note that in the invention of a method, all the processes (steps) may be realized by automatic control by a computer. Furthermore, while causing a computer to perform each process, progress control between the processes may be performed by a human hand. Moreover, at least a part of all processes may be performed by a human hand.

As described above, the present invention is not limited to the above-described embodiments as it is, and can be embodied by modifying the constituent elements without departing from the gist of the present invention in the implementation stage. Furthermore, various inventions can be formed by appropriately combining a plurality of constituent elements disclosed in the above embodiments. For example, some constituent elements may be deleted from all the constituent elements shown in the embodiments. Moreover, constituent elements in different embodiments may be appropriately combined.

DESCRIPTION OF REFERENCE NUMERALS 1 substrate processing apparatus
10 housing
12 load port
14a to 14d polishing module
16 first cleaning module
18 second cleaning module
2 polishing unit
20 drying module
22 first conveyance robot
24 substrate transfer module
26 second conveyance robot
28 third conveyance robot
30 controller
301 roller
301a holding part
301b shoulder part
307 sponge member
310 sponge member rotating mechanism
311 sponge member rotating mechanism
315 cleaning liquid nozzle
317 rinse liquid nozzle
320 guide rail
321 lifting mechanism
40 to 40h substrate detection sensor
401 nozzle
402 thermocouple
404 electromagnetic valve
405 supply pipe
406 supply module
407 heater
408 diaphragm pump
409 database server
41 substrate holding and rotating mechanism
410 storage device
411 thermo camera
42 sponge member
44 arm
45 chuck
46 rinse liquid nozzle
47 cleaning liquid nozzle
48 motor
50 turning shaft
51 cleaning tool moving mechanism

What is claimed is:

1. A substrate processing apparatus comprising:
a first module used in a substrate processing process;
a second module used in a substrate processing process after the first module;
a nozzle provided in the second module and configured to supply a target treatment liquid;
a temperature detector that detects a temperature of a treatment liquid inside the nozzle or a temperature of the nozzle;

a substrate detection sensor that detects a position of a substrate, the substrate detection sensor including a first substrate detection sensor that detects presence or absence of the substrate in the first module; and a controller configured to control discharge of the target treatment liquid from the nozzle in the second module according to the temperature of the treatment liquid detected by the temperature detector and a signal indicating that the first detection sensor detects the substrate.

2. The substrate processing apparatus according to claim 1, wherein
the controller controls discharge of the target treatment liquid from the nozzle performed before the substrate is conveyed to the second module according to the temperature detected by the temperature detector when the substrate detection sensor detects that the substrate is located in the first module.

3. The substrate processing apparatus according to claim 1, wherein
the controller performs control to discharge the target treatment liquid from the nozzle in a case where the temperature detected by the temperature detector at a timing when the substrate is detected by the first substrate detection sensor is lower than a target set temperature.

4. The substrate processing apparatus according to claim 3, wherein
the substrate detection sensor includes a second substrate detection sensor that is provided in the second module and detects presence or absence of the substrate, and
the controller performs control to discharge the target treatment liquid from the nozzle in a case where the temperature detected by the temperature detector at a timing when the substrate is detected by the first substrate detection sensor is lower than a target set temperature and the substrate is not detected by the second substrate detection sensor.

5. The substrate processing apparatus according to claim 1, wherein
the controller performs control to issue a notification in a case where the substrate is detected by a first substrate detection sensor and the temperature detected by the temperature detector is lower than a target set temperature, and in a case where the substrate is detected by a second substrate detection sensor.

6. The substrate processing apparatus according to claim 1, wherein
the controller determines execution timing and duration of the discharge according to the temperature detected by the temperature detector, and performs control to discharge the target treatment liquid from the nozzle at the execution timing and duration of the discharge.

7. The substrate processing apparatus according to claim 6, further comprising
a storage device that stores, for every temperature of the treatment liquid in the nozzle or every temperature of the nozzle, a dispensing duration required for the treatment liquid to reach a target set temperature from the temperature,
wherein the controller acquires, from the storage device, a dispensing duration corresponding to the temperature detected by the temperature detector when the substrate detection sensor detects that the substrate is located in the first module, and performs control to discharge the target treatment liquid from the nozzle for the dispensing duration or longer from a time earlier than a predicted substrate processing start time in the second module by the dispensing duration or longer.

8. The substrate processing apparatus according to claim 7, wherein
the storage device further stores a type of the treatment liquid, and a temperature of the treatment liquid in the nozzle or a temperature of the nozzle in association with a target set temperature in addition to a dispensing duration required for the treatment liquid to reach the target set temperature from the temperature, and
the controller acquires, as the dispensing duration from the storage device, a dispensing duration corresponding to the temperature detected by the temperature detector and the type of the treatment liquid in the second module when the substrate is provided in the first module.

9. The substrate processing apparatus according to claim 1, further comprising:
a supply pipe that supplies a treatment liquid to the nozzle; and
a valve provided in the supply pipe,
wherein controlling to discharge the treatment liquid from the nozzle is controlling to open the valve.

10. A substrate processing apparatus comprising:
a first module used in a substrate processing process;
a second module used in a substrate processing process after the first module;
a nozzle provided in the second module and configured to supply a target treatment liquid;
a temperature detector that detects a temperature of a treatment liquid inside the nozzle or a temperature of the nozzle;
a substrate detection sensor that detects a position of a substrate; and
a controller that controls discharge of the target treatment liquid from the nozzle performed before the substrate is conveyed to the second module according to the temperature of the treatment liquid detected by the temperature detector and the position of the substrate,
wherein
the controller performs control to discharge the treatment liquid from the nozzle at a timing when the substrate no longer exists in the first module in a case where the temperature detected by the temperature detector is higher than a target set temperature and a lower limit set temperature lower than the target set temperature, and
the controller performs control to discharge the target treatment liquid from the nozzle at a set timing before the processing process in the first module ends in a case where the temperature detected by the temperature detector is lower than the lower limit set temperature.

11. The substrate processing apparatus according to claim 10, wherein
the first module is a polishing module, and
the set timing before the processing process ends is a timing when a main polishing process ends.

* * * * *